US012563957B2

(12) United States Patent
Ahn et al.

(10) Patent No.: US 12,563,957 B2
(45) Date of Patent: Feb. 24, 2026

(54) DISPLAY DEVICE

(71) Applicant: Samsung Display Co., Ltd., Yongin-Si (KR)

(72) Inventors: Jea Heon Ahn, Hwaseong-si (KR); Seok Joon Hong, Seongnam-si (KR); Myoung Jong Lee, Cheonan-si (KR); Jeong Ki Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 262 days.

(21) Appl. No.: 17/106,227

(22) Filed: Nov. 30, 2020

(65) Prior Publication Data

US 2021/0327973 A1 Oct. 21, 2021

(30) Foreign Application Priority Data

Apr. 17, 2020 (KR) ......................... 10-2020-0046511

(51) Int. Cl.
*H10K 59/88* (2023.01)
*H10K 59/38* (2023.01)
(52) U.S. Cl.
CPC ............. *H10K 59/88* (2023.02); *H10K 59/38* (2023.02)
(58) Field of Classification Search
CPC ..... H01L 27/322; H01L 27/3244–3279; H01L 27/3233; G02F 1/133354; H10K 59/12–1315; H10K 59/88; H10K 59/38
See application file for complete search history.

(56) References Cited

U.S. PATENT DOCUMENTS

| | | | |
|---|---|---|---|
| 9,368,745 B2 | 6/2016 | Lee et al. | |
| 9,954,042 B2 | 4/2018 | Lee et al. | |
| 10,083,944 B2 | 9/2018 | Lee | |
| 11,223,024 B2 | 1/2022 | Kim | |
| 2008/0230929 A1* | 9/2008 | Shin | H01L 22/34 257/E23.179 |
| 2015/0249054 A1* | 9/2015 | Tian | H01L 23/544 257/797 |
| 2018/0062111 A1* | 3/2018 | Kim | H01L 51/0096 |
| 2021/0066203 A1* | 3/2021 | Zhang | G02F 1/1345 |

(Continued)

FOREIGN PATENT DOCUMENTS

| | | |
|---|---|---|
| KR | 10-2006-0086712 A | 8/2006 |
| KR | 10-0874922 B1 | 12/2008 |
| KR | 10-2014-0065284 A | 5/2014 |

(Continued)

*Primary Examiner* — Lauren R Bell
(74) *Attorney, Agent, or Firm* — Innovation Counsel LLP

(57) ABSTRACT

A display device is provided. The display device comprises a substrate including a display area and a non-display area, the non-display area including an alignment region, and a first alignment key and a second alignment key which are disposed in the alignment region, wherein each of the first alignment key and the second alignment key includes an alignment pattern having a main portion, a reference portion protruding from the main portion, and at least one sub-protrusion portion protruding from the main portion and spaced apart from the reference portion, and wherein the reference portions for the first alignment key and the second alignment key are arranged at a same position as each other, and the protrusion portions are arranged at different positions from each other.

20 Claims, 35 Drawing Sheets

(56)                    References Cited

U.S. PATENT DOCUMENTS

2021/0103079 A1*    4/2021   Lee ........................ G02B 5/201

FOREIGN PATENT DOCUMENTS

| KR | 10-2015-0129551 A | 11/2015 |
| KR | 10-2018-0024819 A | 3/2018 |
| KR | 10-1835557 B1 | 3/2018 |
| KR | 10-2018-0059249 A | 6/2018 |
| KR | 10-2021-0041674 A | 4/2021 |

* cited by examiner

DISPLAY DEVICE

CROSS-REFERENCE TO RELATED APPLICATION

This application claims priority from Korean Patent Application No. 10-2020-0046511 filed on Apr. 17, 2020, in the Korean Intellectual Property Office, and all the benefits accruing therefrom under 35 U.S.C. 119, the contents of which in its entirety are herein incorporated by reference

BACKGROUND

1. Field

The present disclosure generally relates to a display device, and more particularly to a display device capable of improving the alignment accuracy of color conversion layers.

2. Description of the Related Art

Recently, the importance of a display device has increased with the development of multimedia devices. Accordingly, various types of display devices, such as a liquid crystal display (LCD) and an organic light emitting display (OLED) have been used in various multimedia devices.

Among these display devices, an organic light emitting display device is a self-light emitting device that emits light by itself, and has advantages of fast response speed, high light emission efficiency, high luminance, and a wide view angle. Generally, the organic light emitting display device may include a plurality of pixels in a single panel. Each pixel may include an organic light emitting diode disposed on a substrate on which a thin film transistor is formed.

As one method for allowing each pixel to uniquely express one primary color, there is a method of providing a color conversion member for each pixel on an optical path leading to a user.

As an example of the color conversion member, a color conversion member using a wavelength shifter such as a quantum dot may be exemplified. The color conversion member may be provided on a color conversion substrate facing a display substrate on which an organic light emitting diode is formed. Since the color conversion substrate is provided with various layers, each of the layers needs to be formed in an accurate alignment state. Accordingly, patterns such as a plurality of alignment keys may be formed in the non-display area of the color conversion substrate. Thus, there is need to develop a novel device and method to improve the alignment accuracy of color conversion layers.

SUMMARY

Aspects of the disclosure are to provide a display device capable of accurately checking whether or not layers of a color conversion substrate are aligned through a plurality of alignment keys.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprises a substrate including a display area and a non-display area, the non-display area including an alignment region, and a first alignment key and a second alignment key, which are disposed in the alignment region, wherein each of the first alignment key and the second alignment key includes an alignment pattern having a main portion, a reference portion protruding from the main portion, and at least one sub-protrusion portion protruding from the main portion and spaced apart from the reference portion, and wherein the reference portions for the first alignment key and the second alignment key are arranged at a same position as each other, and the protrusion portions for the first alignment key and the second alignment key are arranged at different positions from each other.

In an embodiment, the reference portion extends and protrudes outward from any one corner of the main portion.

In an embodiment, the at least one sub-protrusion portion extends and protrudes outward from at least one other corner of the main portion.

In an embodiment, the reference portion and the sub-protrusion portion have different planar shapes from each other.

In an embodiment, the reference portion and the sub-protrusion portion have a same planar shape as each other, and have different planar areas from each other.

In an embodiment, each of the first alignment key and the second alignment key further includes a layer pattern, and the layer pattern is disposed at a center of the main portion of the alignment pattern.

In an embodiment, the alignment pattern includes an opening formed at the center of the main portion, and the layer pattern is spaced apart from the main portion and disposed on the opening.

In an embodiment, the main portion, the reference portion, and the sub-protrusion portion of the alignment pattern, and the layer pattern are disposed on a same layer.

In an embodiment, the layer pattern includes two pairs of outer sides facing each other, and the reference portion and the sub-protrusion portion do not overlap a partition region defined by imaginary extension lines of the outer sides.

In an embodiment, alignment degree of the layer pattern is determined by measuring a distance between one inner side of the main portion in the partition region and one outer side of the layer pattern adjacent to the one inner side of the main portion and facing the one inner side of the main portion.

In an embodiment, the display area further includes a first color filter, a first color pattern, and a second color pattern, which are disposed on the substrate, a first light blocking member, a second light blocking member, and a third light blocking member, which are disposed on the first color filter, the first color pattern, and the second color pattern, respectively, a second color filter disposed between the first light blocking member and the second light blocking member, and a third color filter disposed between the second light blocking member and the third light blocking member, a light transmitting pattern disposed on the first color filter to overlap the first color filter, a first wavelength conversion pattern disposed on the second color filter to overlap the second color filter, and a second wavelength conversion pattern disposed on the third color filter to overlap the third color filter, and a color mixing prevention member disposed between the light transmitting pattern, the first wavelength conversion pattern, and the second wavelength conversion pattern, wherein the layer pattern includes a same material as any one of the first color filter, the first light blocking member, the second light blocking member, the to third light blocking members, the second color filter, the third color filter, the light transmitting pattern, the first wavelength conversion pattern, the second wavelength conversion pattern, and the color mixing prevention member.

According to an embodiment of the disclosure, a display device, comprises a substrate including a display area and a non-display area, the non-display area including an alignment region, and a plurality of alignment keys disposed in the alignment region, wherein each of the plurality of alignment keys includes an alignment pattern having a main portion, a reference portion protruding from the main portion, and at least one sub-protrusion portion protruding from the main portion and spaced apart from the reference portion, and a layer pattern spaced apart from the main portion and disposed at a center of the main portion, wherein, in the plurality of alignment keys, the reference portions are arranged at a same position as each other, and wherein the protrusion portions are arranged at different positions from each other, and the layer patterns respectively provided in the plurality of alignment keys include different materials from each other.

In an embodiment, each of the main portions of the plurality of alignment keys includes first and second sides facing each other, a third side intersecting the first side, and a fourth side facing the third side, and each of the main portions thereof includes a first region of the first side protruding in an extending direction of the fourth side and adjacent to the fourth side, a second region of the fourth side protruding in an extending direction of the first side and adjacent to the first side, a third region of the fourth side protruding in an extending direction of the first side and adjacent to the second side, a fourth region of the second side protruding in an extending direction of the fourth side and adjacent to the fourth side, a fifth region of the second side protruding in an extending direction of the fourth side and adjacent to the third side, and a sixth region of the third side protruding in an extending direction of the first side and adjacent to the second side.

In an embodiment, the first region represents a site of 0th power of 2 in binary number, the second region represents a site of 1st power of 2 in binary number, the third region represents a site of 2nd power of 2 in binary number, the fourth region represents a site of 3rd power of 2 in binary number, the fifth region represents a site of 4th power of 2 in binary number, and the sixth region represents a site of 5th power of 2 in binary number, and when the sub-protrusion portion is disposed in each of the first region to the sixth region, a binary number of 1 is represented, and when the sub-protrusion portion is not disposed in each of the first region to the sixth region, a binary number of 0 is represented.

In an embodiment, the plurality of alignment keys include a first alignment key, a second alignment key, a third alignment key, a fourth alignment key, a fifth alignment key, a sixth alignment key, a seventh alignment key, and an eighth alignment key, which are spaced apart from each other, and the first alignment key including the sub-protrusion portion formed in the first region represents a binary number of 000001, which is a decimal number of 1, the second alignment key including the sub-protrusion portion formed in the second region represents a binary number of 000010, which is a decimal number of 2, the third alignment key including the sub-protrusion portions formed in the first region and the second region represents a binary number of 000011, which is a decimal number of 3, the fourth alignment key including the sub-protrusion portion formed in the third region represents a binary number of 000100, which is a decimal number of 4, the fifth alignment key including the sub-protrusion portions formed in the first region and the third region represents a binary number of 000101, which is a decimal number of 5, the sixth alignment key including the sub-protrusion portions formed in the second region and the third region represents a binary number of 000110, which is a decimal number of 6, the seventh alignment key including the sub-protrusion portions formed in the second region and the third protrusion portion represents a binary number of 000111, which is a decimal number of 7, and the eighth alignment key including the sub-protrusion portion formed in the fourth region represents a binary number of 001000, which is a decimal number of 8.

In an embodiment, the reference portion extends and protrudes outward from any one corner of the main portion.

In an embodiment, the main portion, the reference portion, and the sub-protrusion portion of the alignment pattern, and the layer pattern are disposed on a same layer.

In an embodiment, the layer pattern includes two pairs of lateral sides facing each other, and the reference portion and the sub-protrusion portion do not overlap a partition region defined by extension lines of the lateral sides.

In an embodiment, alignment degree of the layer pattern is determined by measuring a distance between one inner side of the main portion in the partition region and one outer side of the layer pattern adjacent to the one inner side of the main portion and facing the one inner side of the main portion.

In an embodiment, the display device further comprises a display substrate facing the substrate and including at least one light emitting element, and a filler disposed between the substrate and the display substrate.

BRIEF DESCRIPTION OF THE DRAWINGS

The above and other aspects and features of the disclosure will become more apparent by describing in detail exemplary embodiments thereof with reference to the attached drawings, in which:

FIG. 3 is a schematic cross-sectional view of a display device according to an embodiment;

DETAILED DESCRIPTION OF THE EMBODIMENTS

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

Hereinafter, embodiments of the disclosure will be described with reference to the attached drawings.

Figure 1:
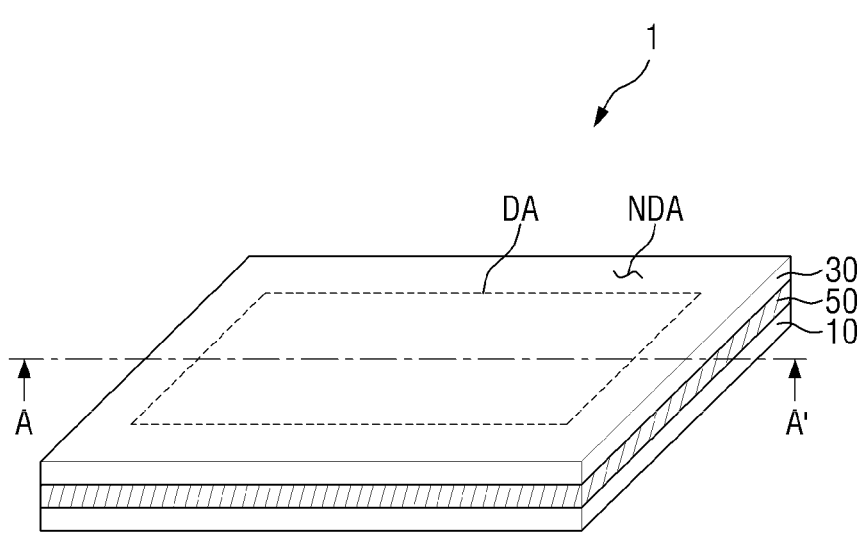
FIG. 1 is a schematic perspective view of a display device according to an embodiment.
Figure 1:
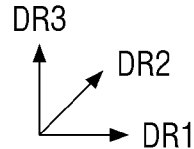
Figure 2:
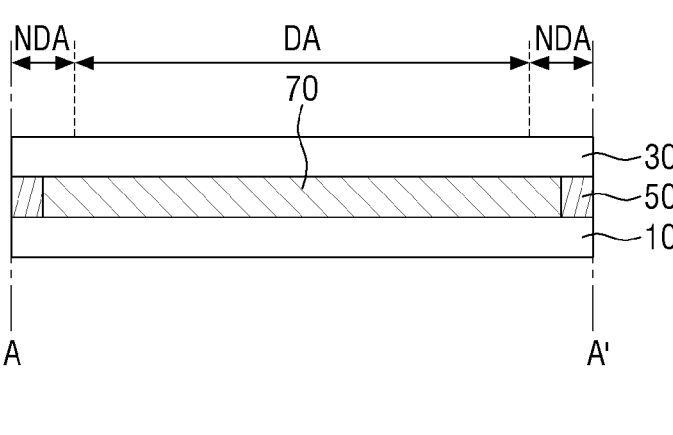
FIG. 2 is a schematic cross-sectional view of the display device taken along line A-A' in FIG. 1.

FIG. 1 is a schematic perspective view of a display device according to an embodiment, and FIG. 2 is a schematic cross-sectional view of the display device taken along line A-A' in FIG. 1.

Referring to FIGS. 1 and 2, a display device 1 may be applied to various electronic appliances such as tablet PCs, smart phone, car navigation units, cameras, center information displays (CIDs) for cars, wrist watch-type electronic devices, personal digital assistant (PDAs), portable multimedia players (PMPs), game machines, televisions, outside billboards, monitors, personal computers, and notebook computers. These electronic appliances are provided only as examples, and it should be understood that this display device may be applied to other electronic appliances as long as it does not depart from the concept of the disclosure.

In some embodiments, the display device 1 may have a rectangular shape in a plan view. The display device 1 may include two first sides extending in a first direction DR1 and two second sides extending in a second direction DR2 crossing the first direction DR1. The corner where the first side and second side of the display device 1 meet each other may be a right angle, but is not limited thereto, and may have a surface. In some embodiments, the first side may be shorter than the second side, but the disclosure is not limited thereto. The planar shape of the display device 1 is not limited to the illustrated one, and may have a circular shape or other different shapes.

The display device 1 may include a display area DA where an image is displayed and a non-display area NDA where an image is not displayed. In an embodiment, the non-display area NDA may be located around the display area DA, and may surround the display area DA.

Referring to the schematic laminated structure of the display device 1, in an embodiment, the display device 1 may include a display substrate 10 and a color conversion substrate 30 facing the display substrate 10, and may further include a sealing member 50 coupling the display substrate 10 and the color conversion substrate 30 and a filler 70 charged between the display substrate 10 and the color conversion substrate 30.

The display substrate 10 may include elements and circuits for displaying an image. For example, the display substrate 10 may include a pixel circuit such as a switching element, a pixel defining layer defining a light emitting area, and a non-light emitting area, which will be later, in the display area DA, and a self-light emitting element. In an embodiment, the self-light emitting element may include at least one of an organic light emitting diode, a quantum dot light emitting diode, and an inorganic light emitting diode. Hereinafter, a case where the self-light emitting element is an organic light emitting diode will be described.

The color conversion substrate 30 may be disposed over the display substrate 10 and face the display substrate 10. In an embodiment, the color conversion substrate 30 may include a color conversion pattern for converting the color of incident light. In an embodiment, the color conversion pattern may include at least one of a color filter and a wavelength conversion pattern.

The sealing member 50 may be disposed between the display substrate 10 and the color conversion substrate 30 in the non-display area NDA. The sealing member 50 may be disposed along the edges of the display substrate 10 and the color conversion substrate 30 in the non-display area NDA to surround the display area DA on a plane. The display substrate 10 and the color conversion substrate 30 may be coupled to each other through the sealing member 50.

In an embodiment, the sealing member 50 may be formed of an organic material. For example, the sealing member 50 may be formed of epoxy resin, but the material thereof is not limited thereto.

The filler 70 may be located in a space between the display substrate 10 and the color conversion substrate 30, the space being surrounded by the sealing member 50. The filler 70 may fill the space between the display substrate 10 and the color conversion substrate 30.

In an embodiment, the filler 70 may be formed of a light-transmitting material. In an embodiment, the filler 70 may be formed of an organic material. For example, the filler 70 may be formed of a Si-based organic material, an epoxy-based organic material, or the like, but the material thereof is not limited thereto. In some embodiments, the filler 70 may be omitted.

Hereinafter, a structure of the display device 1 will be described.

Figure 3:
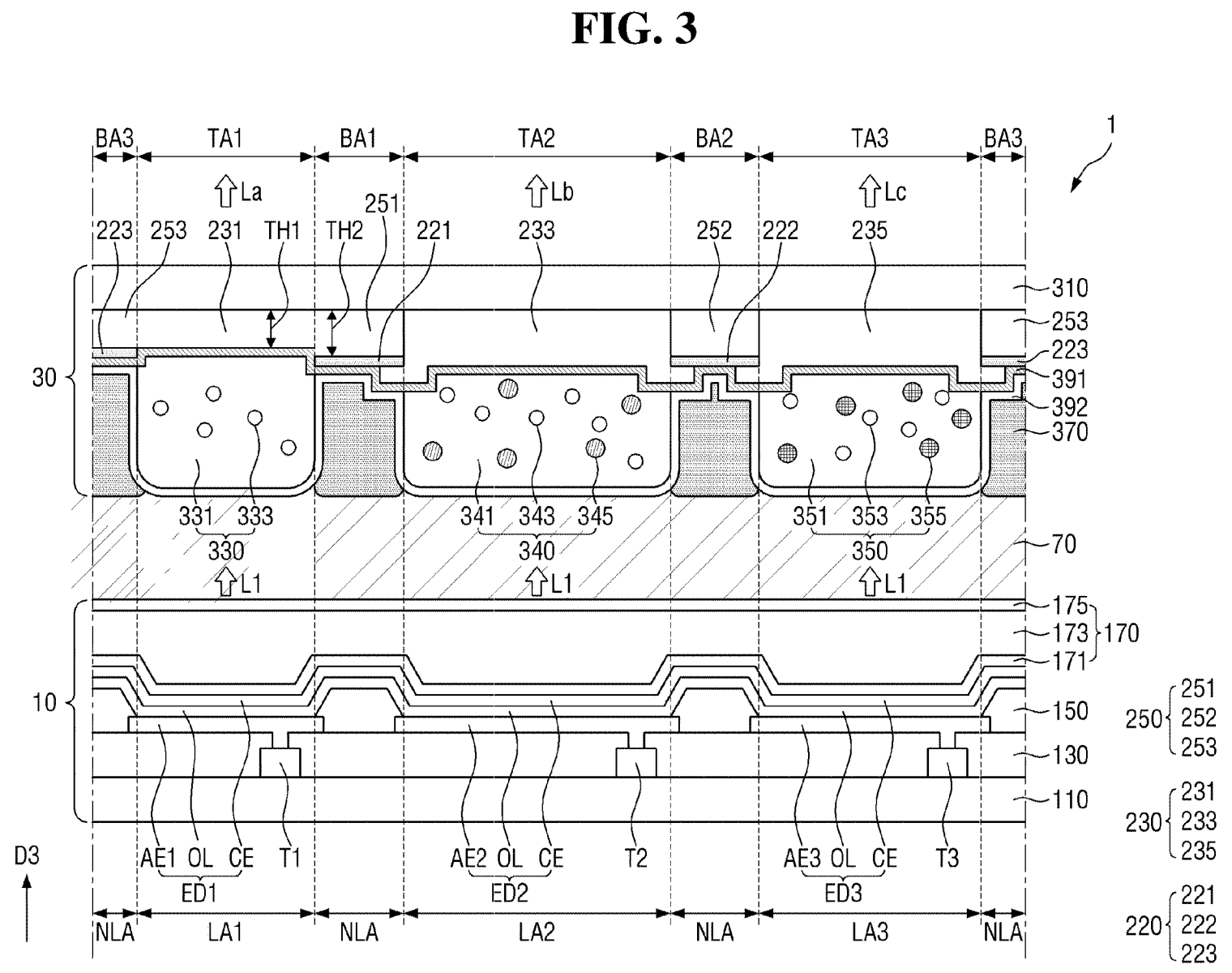

FIG. 3 is a schematic cross-sectional view of a display device according to an embodiment.

Referring to FIG. 3, the display device 1 may include a display substrate 10, a color conversion substrate 30 facing the display substrate 10, and a filler 70 located between the display substrate 10 and the color conversion substrate 30.

The display substrate 10 may include a first substrate 110. The first substrate 110 may be an insulating substrate. The first substrate 110 may include a transparent material.

For example, the first substrate 110 may include a transparent insulating material such as glass or quartz. The first substrate 110 may be a rigid substrate. However, the first substrate 110 is not limited thereto, may include plastic such as polyimide, and may have flexible characteristics that can be warped, bent, folded, or rolled. A plurality of light emitting areas LA1, LA2, and LA3 and a non-light emitting area NLA may be defined in the first substrate 110. Each of the non-light emitting area NLA may be disposed between the plurality of light emitting areas LA1, LA2, and LA3.

Switching elements T1, T2, and T3 may be located on the first substrate 110. In an embodiment, the first switching element T1 may be located in the first light emitting area LA1 of the first substrate 110, the second switching element T2 may be located in the second light emitting area LA2 thereof, and the third switching element T3 may be located in the third light emitting area LA3 thereof. However, the disclosure is not limited thereto, and in another embodiment, at least one of the first switching element T1, the second switching element T2, and the third switching element T3 may be located in the non-light emitting area NLA.

In an embodiment, each of the first switching element T1, the second switching element T2, and the third switching element T3 may be a thin film transistor including amorphous silicon, polysilicon, or oxide semiconductor. Although not shown in the drawings, a plurality of signal lines (for example, gate lines, data lines, power lines, etc.) for transmitting signals to the respective switching element may be further located on the first substrate 110.

An insulating layer 130 may be located on the first switching element T1, the second switching element T2, and the third switching element T3. In an embodiment, the insulating layer 130 may be a planarization layer. In an embodiment, the insulating layer 130 may be formed of an organic layer. For example, the insulating layer 130 may include acrylic resin, epoxy resin, imide resin, ester resin, or the like. In an embodiment, the insulating layer 130 may include a positive photosensitive material or a negative photosensitive material.

A first anode electrode AE1, a second anode electrode AE2, and a third anode electrode AE3 may be located on the insulating layer 130. The first anode electrode AE1 is located in the first light emitting area LA1, but at least a portion of the first anode electrode AE1 may extend up to the non-light emitting area NLA. The second anode electrode AE2 is located in the second light emitting area LA2, but at least a portion of the second anode electrode AE2 may extend up to the non-light emitting area NLA. The third anode electrode AE3 is located in the third light emitting area LA3, but at least a portion of the third anode electrode AE3 may extend up to the non-light emitting area NLA. The first anode electrode AE1 may penetrate the insulating layer 130 to be connected to the first switching element T1, the second anode electrode AE2 may penetrate the insulating layer 130 to be connected to the second switching element T2, and the third anode electrode AE3 may penetrate the insulating layer 130 to be connected to the third switching element T3.

The first anode electrode AE1, the second anode electrode AE2, and the third anode electrode AE3 may be reflective electrodes. Each of the first anode electrode AE1, the second anode electrode AE2, and the third anode electrode AE3 may have a stacked layer structure in which a high-work-function material layer including Indium-Tin-Oxide (ITO), Indium-Zinc-Oxide (IZO), Zinc Oxide (ZnO), or Induim Oxide ($In_2O_3$) and a reflective material layer including silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca) or a mixture thereof are stacked. The high-work-function material layer may be disposed over the reflective material layer to be disposed closer to a light emitting layer OL. Each of the first anode electrode AE1, the second anode electrode AE2, and the third anode electrode AE3 may have a multi-layer structure of ITO/Mg, ITO/MgF, ITO/Ag, or ITO/Ag/ITO, but the disclosure is not limited thereto.

A pixel defining layer 150 may be located on the first anode electrode AE1, the second anode electrode AE2, and the third anode electrode AE3. The pixel defining layer 150 may include an opening exposing the first anode electrode AE1, an opening exposing the second anode electrode AE2, and an opening exposing the third anode electrode AE3, and may define a first light emitting area LA1, a second light emitting area LA2, a third light emitting area LA3, and a non-light emitting area NLA. That is, an area of the first anode electrode AE1, the area being exposed without being covered by the pixel defining layer 150, may be the first light emitting area LAL An area of the second anode electrode AE2, the area being exposed without being covered by the pixel defining layer 150, may be the second light emitting area LA1. An area of the third anode electrode AE2, the area being exposed without being covered by the pixel defining layer 150, may be the third light emitting area LA1. In addition, an area in which the pixel defining layer 150 is located may be the non-light emitting area NLA.

The pixel defining layer 150 may include an organic insulating material such as acrylic resin, epoxy resin, phenolic resin, polyamide resin, polyimide rein, unsaturated polyester resin, polyphenylenether resin, polyphenylenesulfide resin or benzocyclobutene (BCB).

In an embodiment, the pixel defining layer 150 may overlap color patterns and light blocking members of the color conversion substrate 30 which will be described later. For example, the pixel defining layer 150 may overlap a first light blocking member 221, a second light blocking member 222, and a third light blocking member 223. The pixel defining layer 150 may overlap a first color pattern 251, a second color pattern 252, and a third color pattern 253. The pixel defining layer 150 may also overlap a color mixing prevention member 370 which will be described later.

A light emitting layer OL may be located on the first anode electrode AE1, the second anode electrode AE2, and the third anode electrode AE3. In an embodiment in which the display device 1 is an organic light emitting display device, the light emitting layer OL may include an organic layer including an organic material. The organic layer includes an organic light emitting layer, and in some cases, may further include at least one of a hole injection layer, a hole transport layer, an electron transport layer, and an electron injection layer as an auxiliary layer for assisting light emission. In another embodiment, when the display device 1 is a micro LED display device, a nano LED display device, or the like, the light emitting layer OL may include an inorganic material such as an inorganic semiconductor.

In an embodiment, the light emitting layer OL may have a tandem structure including a plurality of organic light emitting layers disposed to overlap each other in a thickness direction which is a third direction DR3 and a charge generating layer disposed therebetween. The organic light emitting layers disposed to overlap each other may emit light of the same wavelength, but may emit light of different wavelengths.

In an embodiment, the light emitting layer OL may have a shape of a continuous layer formed over the plurality of light emitting areas LA1, LA2, and LA3 and the non-light emitting area NLA. In this case, the wavelength of light emitted from the light emitting layer OL may be the same. For example, the light emitting layer OL may emit blue light or ultraviolet light from the plurality of light emitting layers LA1, LA2, and LA3.

In another embodiment, the light emitting layer OL may have a shape of a patterned layer for each of the plurality of light emitting areas LA1, LA2, and LA3. In this case, the wavelengths of light emitted from the light emitting layer OL may be different from each other for each of the plurality of light emitting areas LA1, LA2, and LA3. For example, the first light emitting area LA1 may emit light of a first color, the second light emitting area LA2 may emit light of a second color, and the third light emitting area LA3 may emit light of a third color.

A cathode electrode CE may be located on the light emitting layer OL. In an embodiment, the cathode electrode CE may have semi-permeability or permeability. When the cathode electrode CE has semi-permeability, the cathode electrode CE may include Ag, Mg, Cu, Al, Pt, Pd, Au, Ni, Nd, Jr, Cr, Li, Ca, LiF/Ca, LiF/Al, Mo, Ti, a compound thereof, or a mixture thereof, for example, a mixture of Ag and Mg. When the thickness of the cathode electrode CE is several tens to several hundreds of Angstroms, the cathode electrode CE may have semi-permeability.

When the cathode electrode CE has permeability, the cathode electrode CE may include transparent conductive oxide (TCO). For example, the cathode electrode CE may include tungsten oxide ($W_xO_x$), titanium oxide (TiO2), indium tin oxide (ITO), indium zinc oxide (IZO), zinc oxide (ZnO), indium tin zinc oxide (ITZO), or magnesium oxide (MgO).

The first anode electrode AE1, the light emitting layer OL, and the cathode electrode CE may constitute a first light emitting element ED1, the second anode electrode AE2, the light emitting layer OL, and the cathode electrode CE may constitute a second light emitting element ED2, and the third anode electrode AE3, the light emitting layer OL, and the cathode electrode CE may constitute a third light emitting element ED3. Each of the first light-emitting element ED1, the second light-emitting element ED2, and the third light-emitting element ED3 may discharge emission light, and the emission light may be provided to the color conversion substrate 30.

A thin film encapsulation layer 170 may be located on the cathode electrode CE. The thin film encapsulation layer 170 may be commonly located in the first light emitting area LA1, the second light emitting area LA2, the third light emitting area LA3, and the non-light emitting area NLA. In an embodiment, the thin film encapsulation layer 170 may directly cover the cathode electrode CE. A capping layer (not shown) covering the cathode electrode CE may be further located between the thin film encapsulation layer 170 and the cathode electrode CE, and in this case, the thin film encapsulation layer 170 may directly cover the capping layer.

In an embodiment, the thin film encapsulation layer 170 may include a first encapsulation inorganic layer 171, an encapsulation organic layer 173, and a second encapsulation inorganic layer 175, which are sequentially stacked on the cathode electrode CE along the thickness (third direction DR3) direction.

Each of the first encapsulation inorganic layer 171 and the second encapsulation inorganic layer 175 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride. The encapsulation organic layer 173 may include acrylic resin, methacrylic resin, polyisoprene, vinyl resin, epoxy resin, urethane resin, cellulose resin, or perylene resin. However, the structure of the thin film encapsulation layer 170 is not limited to the above-described example, and the stacked structure of the thin film encapsulation layer 170 may be variously changed.

Meanwhile, the color conversion substrate 30 may be located to face the above-described display substrate 10.

The color conversion substrate 30 may include a second substrate 310. The second substrate 310 may be an insulating substrate. The second substrate 310 may include a transparent material. For example, the second substrate 310 may include a transparent insulating material such as glass or quartz. The second substrate 310 may be a rigid substrate. However, the second substrate 310 is not limited thereto, may include plastic such as polyimide, and may have flexible characteristics that can be warped, bent, folded, or rolled. As described above, a plurality of light transmitting areas TA1, TA2, and TA3 and a plurality of light blocking areas BA1, BA2, and BA3 may be defined in the second substrate 310.

A color filter 230 includes a first color filter 231, a second color filter 233, and a third color filter 235. A color pattern 250 includes a first color pattern 241, a second color pattern 252, and a third color pattern 253. The color filter 230 and the color pattern 250 may be located on one surface of the second substrate 310 facing the display substrate 10.

The first color filter 231 may selectively transmit light of the first color (for example, blue light), and may block or absorb light of the second color (for example, red light) and light of the third color (for example, green light). In an embodiment, the first color filter 231 may be a blue color filter, and may include a blue colorant such as a blue dye or a blue pigment. The first color filter 231 may have a larger size than other color filters for white balance. In this specification, the colorant is a concept including both a dye and a pigment.

The color pattern 250 may absorb a portion of light traveling from the outside of the display device 1 into the color conversion substrate 30 to reduce reflected light due to external light. In the display device 1, external light may be partially reflected, thereby causing a problem of distorting the color reproduction rate of the color conversion substrate 30. However, in the embodiment, as the color pattern 250 is disposed on the second substrate 310, the amount of reflected external light may be reduced, and color distortion caused by the external light may be reduced.

In an embodiment, the color pattern 250 may include a blue colorant such as a blue dye or a blue pigment. In an embodiment, the color pattern 250 may include the same material as the first color filter 231, and may be simultaneously formed in the process of forming the first color filter 231. That is, the first color filter 231 and the color pattern 250 may be simultaneously formed by applying a photosensitive organic material including a blue colorant onto one surface of the second substrate 310 and exposing and developing the applied photosensitive organic material.

When the color pattern 250 includes a blue colorant, external light or reflected light transmitted through the color pattern 250 has a blue wavelength band. The color sensibility of eyes perceived by a user's eyes depends on the color of light. More specifically, light of a blue wavelength band may be perceived to be less sensitive to the user than light of a green wavelength band and light of a red wavelength band. Therefore, as the color pattern 250 includes a blue colorant, the user may recognize reflected light relatively less sensitively.

The color pattern 250 may be located on one surface of the second substrate 310, and may overlap the light blocking areas BA1, BA2, and BA3. Also, the color pattern 250 may overlap the non-light emitting area NLA. In an embodiment, the color pattern 250 may directly contact one surface of the second substrate 310. Alternatively, when a buffer layer for preventing the inflow of impurities is additionally disposed on one surface of the second substrate 310, the color pattern 250 may directly contact the buffer layer.

A light blocking member 220 may be located on one surface of the second substrate 310 facing the display substrate 10. The light blocking member 220 may overlap the light blocking area BA to block the transmission of light. The light blocking member 220 may be disposed in a substantially lattice shape on a plane.

In an embodiment, the light blocking member 220 may include an organic light blocking material, and may be formed through a coating and exposure process of the organic light blocking material. The light blocking member 220 may include a dye or pigment having light blocking properties, and may be a black matrix.

As described above, external light may cause a problem of distorting the color reproduction rate of a color conversion substrate. However, according to the embodiment, when the light blocking member 220 is located on the second substrate 310, at least a portion of the external light is absorbed by the light blocking member 220. Therefore, the distortion of a color due to the reflection of external light may be reduced. In an embodiment, the light blocking member 220 may prevent light from invading between adjacent light transmitting areas to prevent the occurrence of color mixing, thereby further improving the color reproduction rate.

The light blocking member 220 may be located on the color pattern 250. In an embodiment, the first light blocking member 221 may be located on the first color pattern 251, the second light blocking member 222 may be located on the second color pattern 252, and the third light blocking member 223 may be located on the third color pattern 253.

As shown in FIG. 3, the second color filter 233 and the third color filter 235 may be located on one surface of the second substrate 310 facing the display substrate 10.

The second color filter 233 may overlap the second light transmitting area TA2, and the third color filter 235 may overlap the third light transmitting area TA3. In an embodiment, one end of the second color filter 233 may overlap the first light blocking area BA1, and may be located on the first color pattern 251 and the first light blocking member 221. The other end of the second color filter 233 may overlap the second light blocking area BA2 and may be located on the second color pattern 252 and the second light blocking member 222.

In an embodiment, one end of the third color filter 235 may overlap the second light blocking area BA2, and may be located on the second color pattern 252 and the second light blocking member 222. The other end of the third color filter 235 may overlap the third light blocking area BA3, and may be located on the third color pattern 253 and the third light blocking member 223.

The second color filter 233 may block or absorb light of the first color (for example, blue light). That is, the second color filter 233 may function as a blue light blocking filter that blocks blue light. The second color filter 233 may selectively transmit light of the second color (for example, red light), and may block or absorb light of the first color and light of the third color (for example, green light). For example, the second color filter 233 may be a red color filter, and may include a red colorant such as a red dye or a red pigment.

The third color filter 235 may block or absorb light of the first color. That is, the third color filter 235 may function as a blue light blocking filter. The third color filter 235 may selectively transmit light of the third color, and may block or absorb light of the first color and light of the second color. For example, the third color filter 235 may be a green color filter, and may include a green colorant such as a green dye or a green pigment.

As shown in FIG. 3, a first capping layer 391 for covering the light blocking member 220, the color pattern 250, and the color filter 230 may be located on one surface of the second substrate 310. The first capping layer 391 may prevent the penetration of impurities such as moisture or air from the outside to prevent the first color filter 231, the second color filter 233, and the third color filter 235 from being damaged or contaminated. In addition, the first capping layer 391 may prevent colorants of the first color filter 231, the second color filter 233, and the third color filter 235 from diffusing to other components. The first capping layer 391 may directly contact one surface (lower surface in FIG. 3) of each of the first color filter 231, the second color filter 233, and the third color filter 235. Furthermore, the capping layer 391 may directly contact one surface of each of the first blocking member 221, the second blocking member 222, and the third blocking member 223.

The first capping layer 391 may include an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, or silicon oxynitride.

A light transmitting pattern 330 may be located on the first capping layer 391.

In an embodiment, the light transmitting pattern 330 may be formed by applying a photosensitive material and exposing and developing the applied photosensitive material. However, the disclosure is not limited thereto, and the light transmitting pattern 330, the first wavelength conversion pattern 340, and the second wavelength conversion pattern 350 may be formed by an inkjet method.

The light transmitting pattern 330 may be located on the first capping layer 391, and may overlap the first light transmitting area TA1. The light transmitting pattern 330 may transmit incident light. The light emitted from the first light emitting element ED1 may be blue light as described above. The emission light L1, which is blue light, passes through the light transmitting pattern 330 and the first color filter 231 and is emitted to the outside of the display device 1. That is, first light La emitted from the first light transmitting area TA1 may be blue light.

In an embodiment, the light transmitting pattern 330 may include a first base resin 331 and a plurality of first scatterers 333 dispersed in the first base resin 331.

The first base resin 331 may include a material having high light transmittance. In an embodiment, the first base resin 331 may include an organic material. For example, the first base resin 331 may include an organic material such as an epoxy resin, an acrylic resin, a cardo resin, or an imide resin.

The first scatterers 333 may have a refractive index different from that of the first base resin 331, and may form an optical interface together with the first base resin 331. For example, the first scatterers 333 may be light scattering particles. The first scatterers 333 are not particularly limited as long as they may scatter at least a portion of transmitted light, but may be, for example, metal oxide particles or organic particles. Examples of the material of the metal oxide particles include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$), and examples of the material of the organic particles may include acrylic resins and urethane resins. The first scatterrers 333 may scatter light in a random direction irrespective of the incident direction of incident light without substantially converting the wavelength of light passing through the light transmitting pattern 330.

The first wavelength conversion pattern 340 and the second wavelength conversion pattern 350 may be located on the first capping layer 391.

The first wavelength conversion pattern 340 may be located on the first capping layer 391 and may overlap the second light transmitting area TA2 and the fifth light transmitting area TAS. The first wavelength conversion pattern 340 may convert or shift incident light of a peak wavelength into light of a specific peak wavelength, and may emit the light of a specific peak wavelength. In an embodiment, the first wavelength conversion pattern 340 may convert the light L1 provided from the second light emitting element ED2 into red light having a peak wavelength ranging from about 610 nm to about 650 nm, and may emit the red light. That is, the second light Lb emitted from the second light transmitting area TA2 may be red light.

The first wavelength conversion pattern 340 may include a second base resin 341 and first wavelength shifters 345 dispersed in the second base resin 341, and may further include a plurality of second scatterres 343 dispersed in the second base resin 341.

The second base resin 341 may include a material having high light transmittance. In an embodiment, the second base resin 341 may include an organic material. The second base resin 341 may be formed of the same material as the first base resin 331, or may include at least one of the materials exemplified as constituent materials of the first base resin 331.

The first wavelength shifters 345 may convert or shift the peak wavelength of incident light to another specific peak wavelength. In an embodiment, the first wavelength shifters 345 may convert light of the first color, which is blue light provided from the second light emitting element ED2, into red light having a single peak wavelength ranging from about 610 nm to about 650 nm, and may emit the red light.

Examples of the first wavelength shifters 345 may include quantum dots, quantum rods, and phosphors. For example, the quantum dot may be a particulate material that emits light of a specific color while an electron transitions from a conduction band to a valence band.

The quantum dot may be a semiconductor nano-crystalline material. The quantum dot may absorb light of a specific band gap according to its composition and size, and then emit light having a unique wavelength. Examples of the semiconductor nanocrystals of the quantum dot include group IV nanocrystals, group II-VI compound nanocrystals, group III-V compound nanocrystals, group IV-VI nanocrystals, and combinations thereof.

The group II-VI compound may be selected from binary compounds such as CdSe, CdTe, ZnS, ZnSe, ZnTe, ZnO, HgS, HgSe, HgTe, MgSe, MgS, and mixtures thereof; ternary compounds such as InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and quaternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound may be selected from binary compounds such as GaN, GaP, GaAs, GaSb, AN, AlP, AlAs, AlSb, InN, InP, InAs, InSb, and mixtures thereof; ternary compounds such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and quaternary compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected from binary compounds such as SnS, SnSe, SnTe, PbS, PbSe, PbTe, and mixtures thereof; ternary compounds such as SnSeS, SnSeTe, SnSTe, PbSeS, PbSeTe, PbSTe, SnPbS, SnPbSe, SnPbTe, and mixtures thereof; and quaternary compounds such as SnPbSSe, SnPbSeTe, SnPbSTe, and mixtures thereof. The group IV element may be selected from Si, Ge, and a mixture thereof. The group IV compound may be selected from SiC, SiGe, and a mixture thereof.

In this case, the binary compound, the ternary compound, or the quaternary compound may be present in the particle at a uniform concentration, or may be present in the same particle because concentration distribution is partially divided into different states. Further, there may be provided a core-shell structure in which one quantum dot surrounds another quantum dot. The interface between a core and a shell may have a concentration gradient in which the concentration of elements in the shell decreases toward the center.

In an embodiment, the quantum dot may have a core-shell structure including a core including the above-described nanocrystals and a shell surrounding the core. The shell of the quantum dot may serve as a protective layer for maintaining semiconductor characteristics by preventing the chemical denaturation of the core and/or a charging layer for imparting electrophoretic characteristics to the quantum dot. The shell may be a single layer or multiple layers. The interface between the core and the shell may have a concentration gradient in which the concentration of elements in the shell decreases toward the center. Examples of the shell of the quantum dot may include metallic or non-metallic oxides, semiconductor compounds, and combinations thereof.

Examples of the metallic or non-metallic oxides may include, but are not limited to, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; and ternary compounds such as $MgAl_2O_4$, $CoFe_2O_4$, $NiFe_2O_4$, and $CoMn_2O_4$.

Examples of the semiconductor compounds may include, but are not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

The light emitted by the first wavelength shifter 345 may have an emission wavelength spectrum full width of half maximum (FWHM) of about 45 nm or less, or about 40 nm or less, or about 30 nm or less, and thus the color purity and color reproducibility of the color displayed by the display device 1 may be further improved. Further, the light emitted by the first wavelength shifter 345 may be emitted toward various directions regardless of the incident direction of incident light. Thus, the side visibility of the second color displayed in the second light transmitting area TA2 may be improved.

A portion of the light provided from the second light emitting element ED2 may be emitted through the first wavelength conversion pattern 340 without being converted into red light by the first wavelength shifter 345. Further, in the emitted light, the blue light transmitted through the first wavelength conversion pattern 340 may be blocked by the second color filter 233. In contrast, in the emitted light, the red light converted by the first wavelength conversion pattern 340 passes through the second color filter 233 and is emitted to the outside. That is, the second light emitted from the second light transmitting area TA2 may be red light.

The second scatterers 343 may have a refractive index different from that of the second base resin 341, and may form an optical interface together with the second base resin 341. For example, the second scatterers 343 may be light scattering particles. Since a detailed description of the second scatterers 343 is substantially the same as or similar to the description of the first scatterers 333, it will be omitted.

The second wavelength conversion pattern 350 may be located on the first capping layer 391 and may overlap the third light transmitting area TA3. The second wavelength conversion pattern 350 may convert or shift incident light of a peak wavelength into light of a specific peak wavelength, and may emit the light of a specific peak wavelength. In an embodiment, the second wavelength conversion pattern 350 may convert the light L1 provided from the third light emitting element ED3 into green light having a peak wavelength ranging from about 510 nm to about 550 nm, and may emit the green light. That is, the third light Lc emitted from the third light transmitting area TA3 may be green light.

The second wavelength conversion pattern 350 may include a third base resin 351 and second wavelength shifters 355 dispersed in the third base resin 351, and may further include a plurality of second scatterres 353 dispersed in the third base resin 351.

The third base resin 351 may include a material having high light transmittance. In an embodiment, the third base resin 351 may include an organic material. The third base resin 351 may be formed of the same material as the first base resin 331, or may include at least one of the materials exemplified as constituent materials of the first base resin 331.

The second wavelength shifters 355 may convert or shift the peak wavelength of incident light to another specific peak wavelength. In an embodiment, the second wavelength shifters 355 may convert blue light having a peak wavelength ranging from 440 nm to 480 nm into green light having a peak wavelength ranging from about 510 nm to about 550 nm.

Examples of the second wavelength shifters 355 may include quantum dots, quantum rods, and phosphors. For example, the quantum dot may be a particulate material that emits light of a specific color while an electron transitions from a conduction band to a valence band. Since a more detailed description of the second wavelength shifters 355 is substantially the same or similar to the description of the first wavelength shifters 345, it will be omitted.

The second scatterers 353 may have a refractive index different from that of the third base resin 351, and may form an optical interface together with the third base resin 351. For example, the second scatterers 353 may be light scattering particles. Since a detailed description of the second scatterers 353 is substantially the same as or similar to the description of the first scatterers 343, it will be omitted.

The light emitted from the third light emitting element ED3 may be provided to the second wavelength conversion pattern 350, and the second wavelength shifter 355 may convert the light provided from the third light emitting element ED3 into green light having a peak wavelength ranging from about 510 nm to about 550 nm, and may emit the green light.

A portion of the emitted light, which is blue light, may be transmitted through the second wavelength conversion pattern 350 without being converted into green light by the second wavelength shifter 355. The component transmitted through the second wavelength conversion pattern 350 may be blocked by the third color filter 235. In contrast, in the emitted light, the green light converted by the second wavelength conversion pattern 350 passes through the third color filter 235 and is emitted to the outside. That is, the third light emitted from the third light transmitting area TA3 to the outside of the display device 1 may be green light.

When the emitted light is mixed light of deep blue light and light blue light, the emitted light includes both long wavelength components and short wavelength components, so that the movement path of the emitted light incident on the second wavelength conversion pattern 350 may be further increased. Thus, the amount of emitted light provided to the second wavelength shifter 355 may increase, and the light conversion efficiency of the second wavelength conversion pattern 350 may increase. Therefore, color reproducibility of the display device 1 may be further improved.

As shown in FIG. 3, a second capping layer 392 may be located on the light transmitting pattern 330, the first wavelength conversion pattern 340, and the second wavelength conversion pattern 350. The second capping layer 392 may cover the light transmitting pattern 330, the first wavelength conversion pattern 340, and the second wavelength conversion pattern 350. The second capping layer 392 may contact the first capping layer 391. That is, some portions of the second capping layer 392 directly contact the first capping layer, and the other portions of the second capping layer 392 do not contact the first capping layer 391. The second capping layer 392 may encapsulate the light transmitting pattern 330, the first wavelength conversion pattern 340, and the second wavelength conversion pattern 350 together with the first capping layer 391. Therefore, the second capping layer 392 may prevent the penetration of impurities such as moisture or air from the outside to prevent the light transmitting pattern 330, the first wavelength conversion pattern 340, and the second wavelength conversion pattern 350 from being damaged or contaminated.

The second capping layer 392 may include an inorganic material. For example, the second capping layer 392 may include silicon nitride, aluminum nitride, zirconium nitride, titanium nitride, hafnium nitride, tantalum nitride, silicon oxide, aluminum oxide, titanium oxide, tin oxide, or silicon oxynitride.

When both the first capping layer 391 and the second capping layer 392 are formed of an inorganic material, the portion where the first capping layer 391 and the second capping layer 392 directly contact each other may be inorganic-inorganic bonding, and may effectively block the inflow of moisture or air from the outside.

As shown in FIG. 3, a color mixing prevention member 370 may be located on the second capping layer 392. The color mixing prevention member 370 may be located in the light blocking areas BA1, BA2, and BA3 to block the transmission of light. More specifically, the color mixing preventing member 370 may be located between the light transmitting pattern 330 and the first wavelength conversion pattern 340, and between the first wavelength conversion pattern 340 and the second wavelength conversion pattern 350, and between the second wavelength conversion pattern 350 and the light transmitting pattern 330 to prevent the color mixing between the adjacent light transmitting areas.

The color mixing prevention member 370 may include an organic light blocking material, and may be formed through a coating and exposure process of the organic light blocking material. For example, the color mixing preventing member 370 may include a dye or pigment having light blocking properties, and may be a black matrix.

As described above, the filler 70 may be charged in the space between the color conversion substrate 30 and the display substrate 10. That is, as shown in FIG. 3, the filler 70 may be charged between the second capping layer 392 and the thin film encapsulation layer 170 and between the color mixing prevention member 370 and the thin film encapsulation layer 170. The filler 70 may directly contact the second encapsulation inorganic layer 175 and the color mixing prevention member 370.

The aforementioned color conversion substrate 30 may include alignment keys in order to form layers requiring a mask process, for example, the first color filter 231, the light blocking member 220, the second color filter 233, the third color filter 235, the light transmitting pattern 330, the first wavelength conversion pattern 340, the second wavelength conversion pattern 350, and the color mixing prevention member 370.

Hereinafter, the color conversion substrate 30 including alignment keys will be described in detail.

Figure 4:
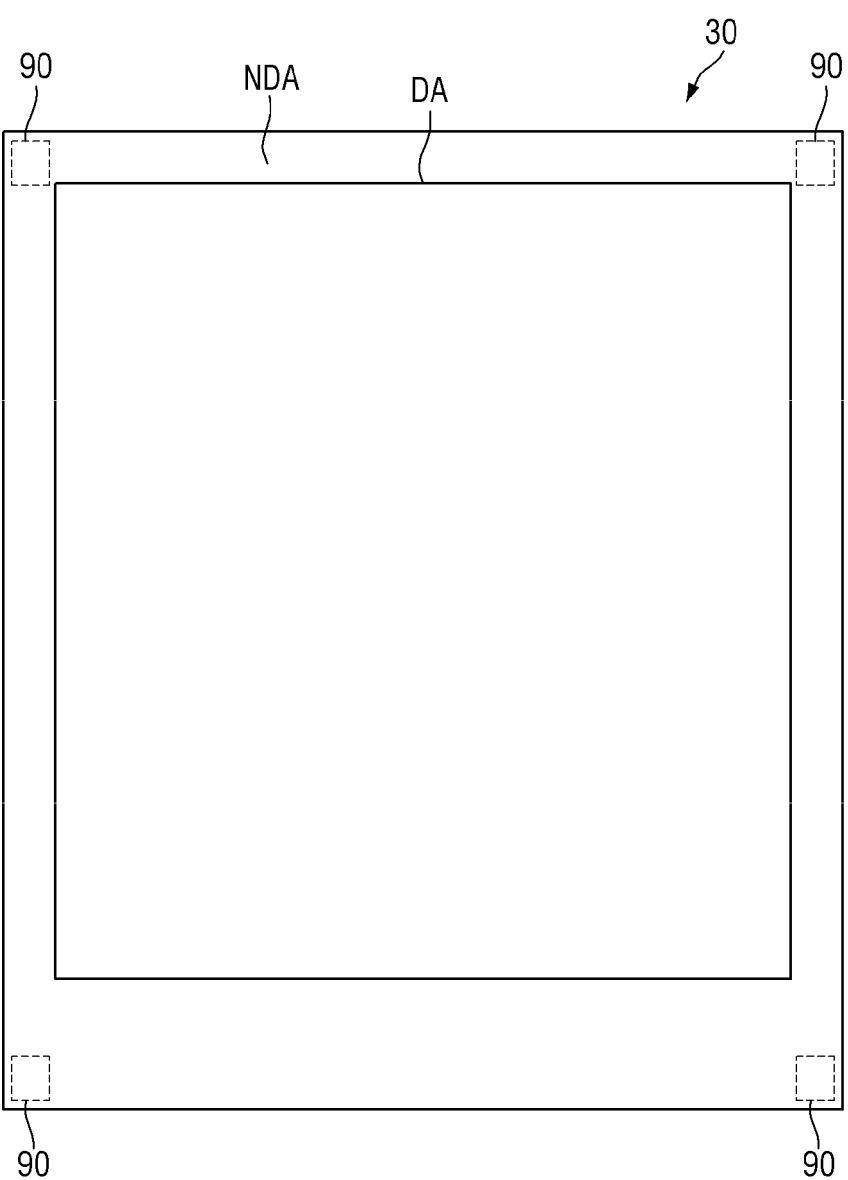
FIG. 4 is a plan view showing a color conversion substrate according to an embodiment.
Figure 5:
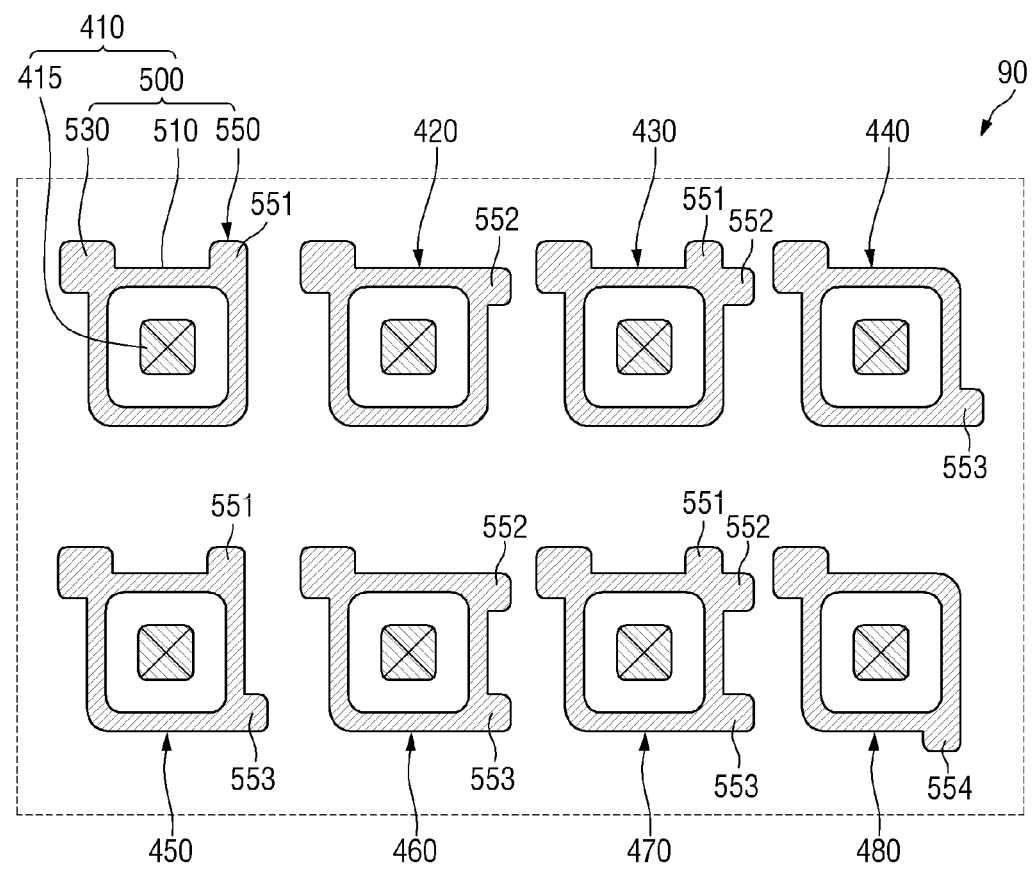
FIG. 5 is a plan view showing an alignment region of a color conversion substrate according to an embodiment.
Figure 6:
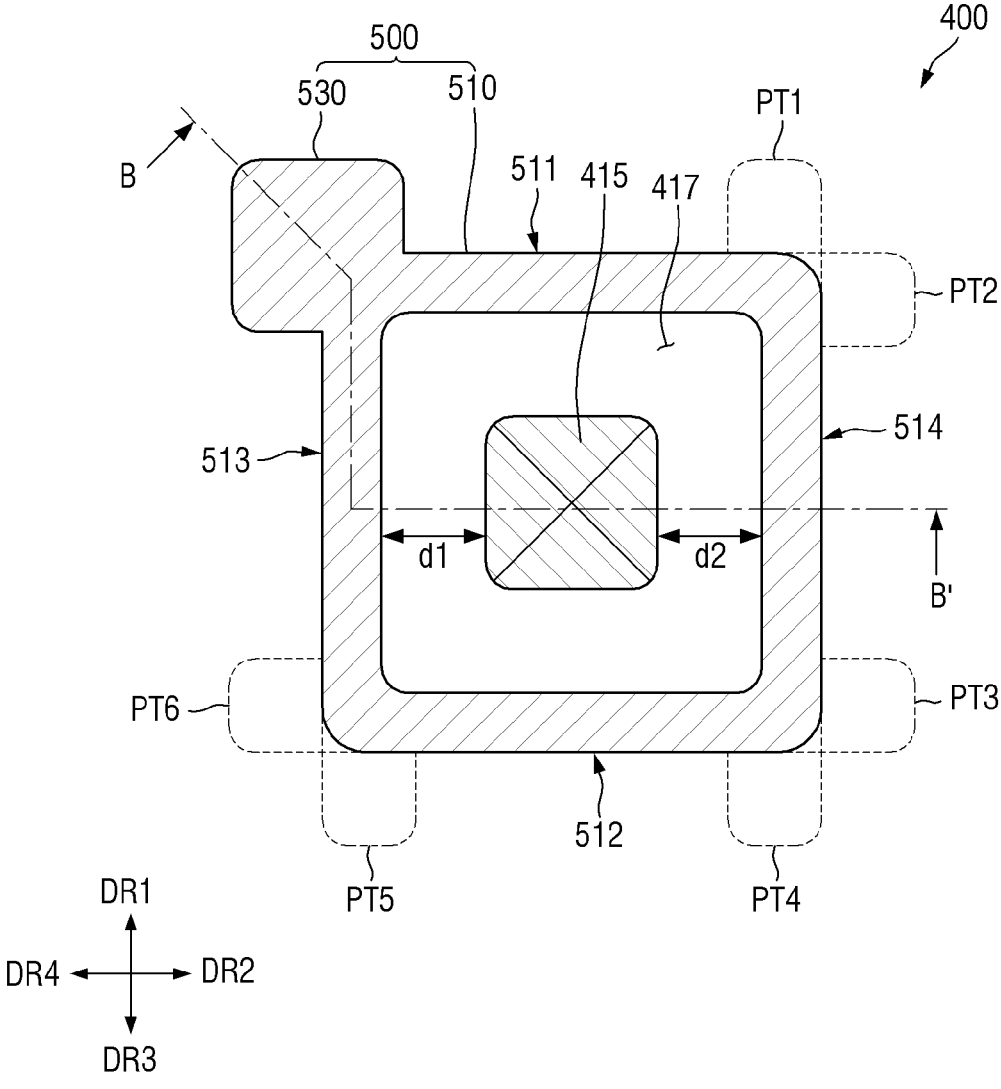
FIG. 6 is a plan view showing an alignment key according to an embodiment.
Figure 7:
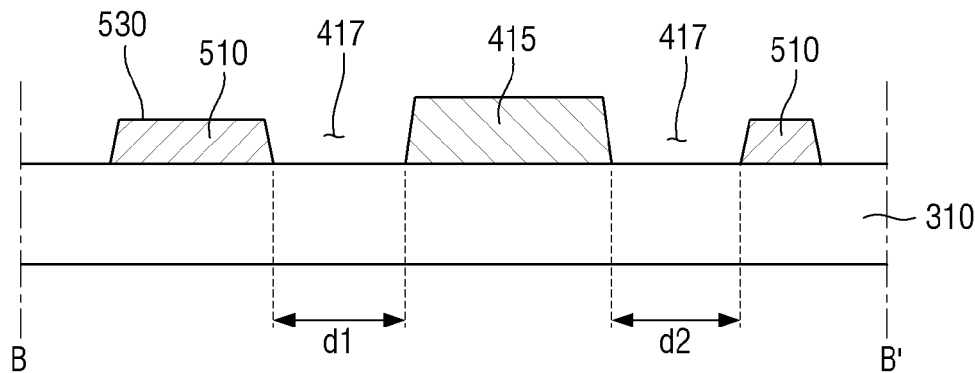
FIG. 7 is a cross-sectional view of the alignment key taken along line B-B' in FIG. 6.
Figure 18:
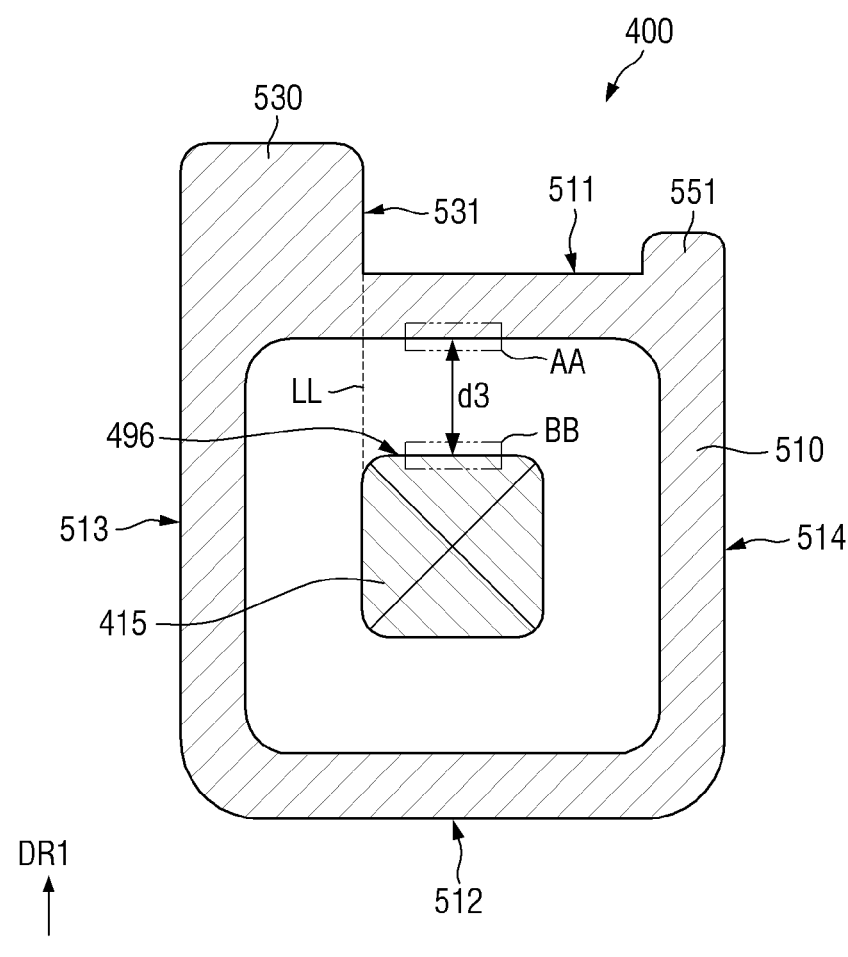
FIGS. 18, 19, and 20 are plan views illustrating various example structures of the reference portion of the alignment key.
Figure 19:
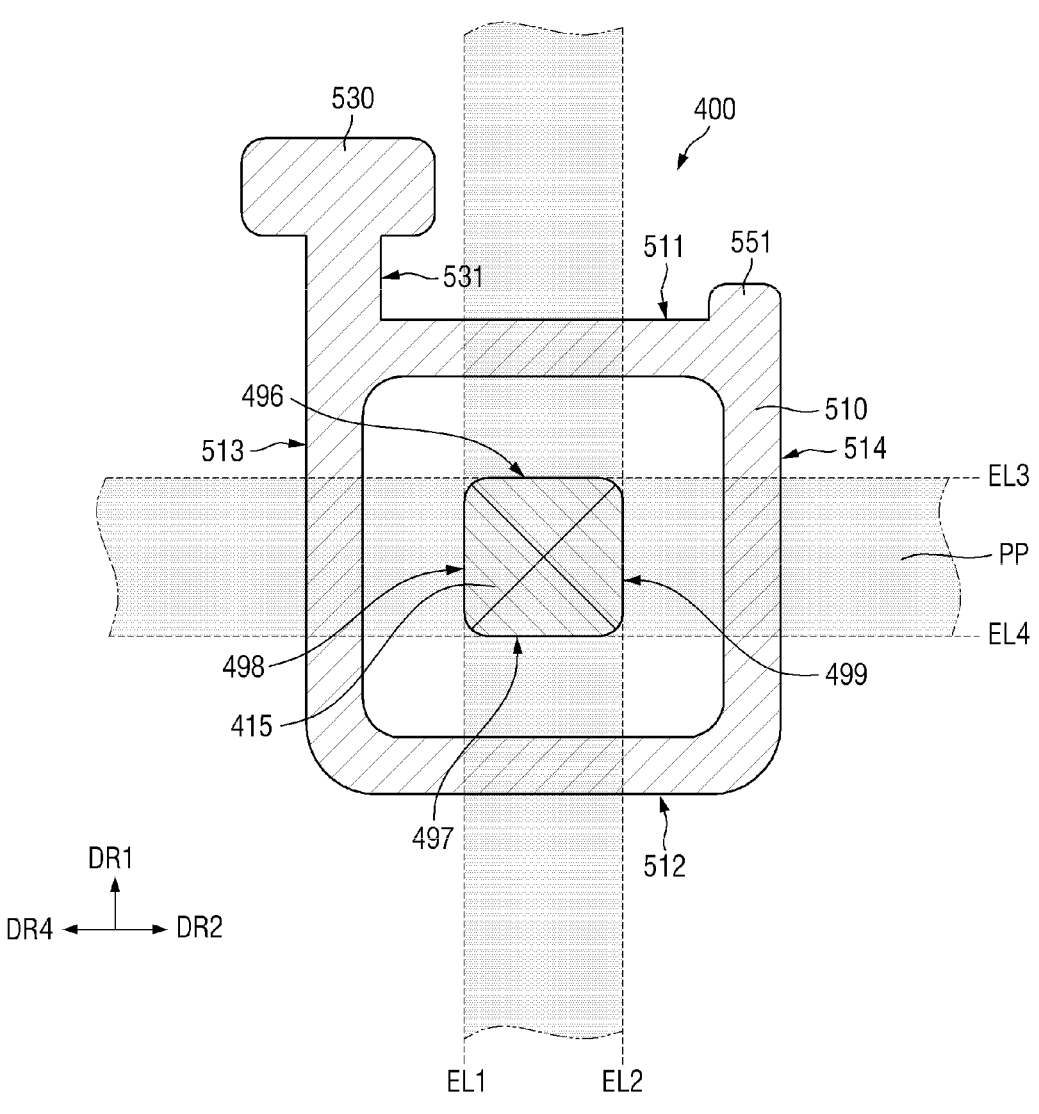
Figure 20:
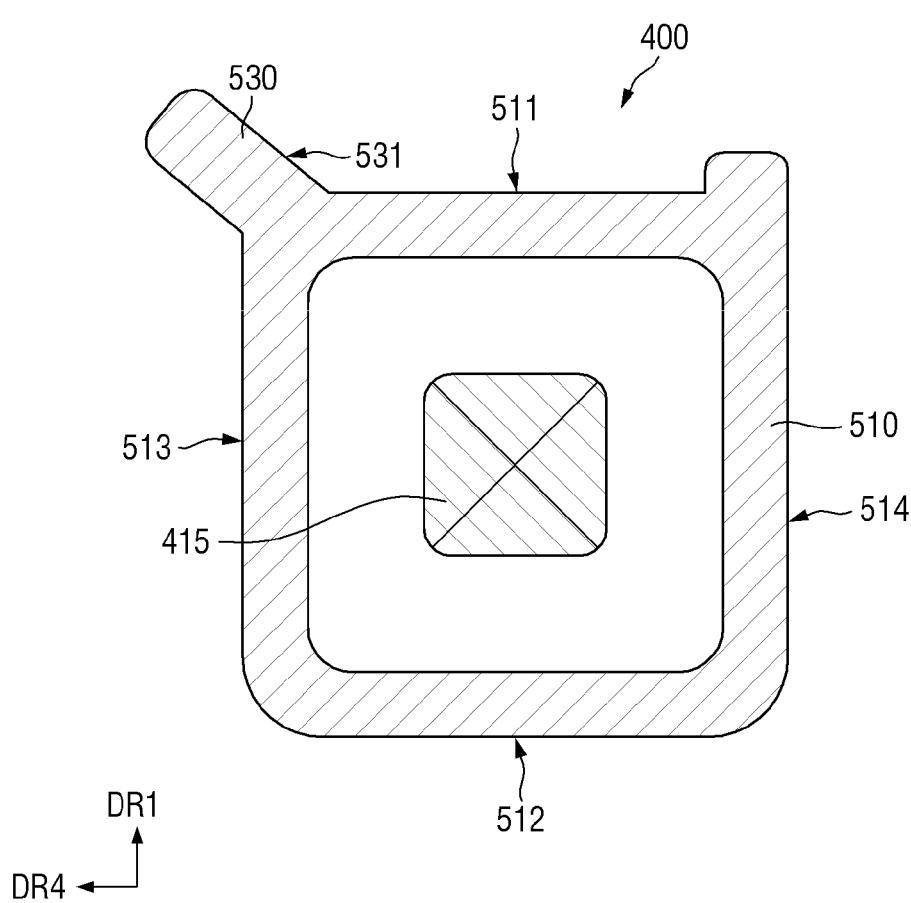

FIG. 4 is a plan view showing a color conversion substrate according to an embodiment, FIG. 5 is a plan view showing an alignment region of a color conversion substrate according to an embodiment, FIG. 6 is a plan view showing an alignment key according to an embodiment, FIG. 7 is a cross-sectional view of the alignment key taken along line B-B' in FIG. 6, FIGS. 8, 9, 10, 11, 12, 13, 14, 15, 16, and 17 are plan views showing various example structures of the alignment key, and FIGS. 18, 19, and 20 are plan views illustrating various example structures of the reference portion of the alignment key.

Referring to FIG. 4, the color conversion substrate 30 according to an embodiment may include a display area DA and a non-display area NDA surrounding the display area DA. Since the display area DA and the non-display area NDA have been described with reference to FIGS. 1 and 2, redundant descriptions will be omitted.

The non-display area NDA may include a plurality of alignment regions 90. The alignment regions 90 may be arranged at four corners of the color conversion substrate 30. Although it is shown in FIG. 4 that the alignment regions 90 are arranged at four corners, respectively, in some embodiments, the alignment regions 90 may be arranged at various positions in various numbers. In an example embodiment, the alignment regions 90 are arranged at two corners of the color conversion substrate 30, but may be arranged diagonally to each other or on the same side surface of the color conversion substrate 30.

Each of the alignment regions 90 may include a plurality of alignment keys. The plurality of alignment keys may be alignment keys corresponding to each layer of the color conversion substrate 30. Hereinafter, details of the alignment key will be described with reference to FIG. 5.

Referring to FIG. 5, a plurality of alignment keys 400 may be arranged in one of the plurality of alignment regions 90. The plurality of alignment keys 400 may be arranged to be spaced apart from each other. As shown in FIG. 5, a total of eight alignment keys 400, 401, 402, 403, 404, 405, 406, 407, and 408 may be arranged in four rows and two columns. In some embodiments, a total of twelve alignment keys may be arranged in four rows and three columns, and a total of eighteen alignment keys may be arranged in six rows and three columns. However, the disclosure is not limited thereto, and the arrangement of the plurality of alignment keys 400, 401, 402, 403, 404, 405, 406, 407, and 408 may be variously adjusted according to the number of alignment keys 400 and the area of the alignment region 90.

The number of alignment keys 400 may be changed depending on the number of layers formed by the mask process on the color conversion substrate 30. For example, if the number of layers formed by the mask process is eight, the number of the alignment keys 400 may be eight or more.

The plurality of alignment keys 400 may include a first alignment key 410, a second alignment key 420, a third alignment key 430, a fourth alignment key 440, a fifth alignment key 450, a sixth alignment key 460, a seventh alignment key 470, and an eighth alignment key 480, which have different shapes from each other. In an embodiment, a case where a total of eight alignment keys 400 are arranged is illustrated as an example, but the disclosure is not limited thereto.

The plurality of alignment keys 400 may have a basic structure shown in FIG. 6.

Referring to FIGS. 6 and 7, one alignment key 400 according to an embodiment may include an alignment pattern 500 and a layer pattern 415.

The alignment pattern 500 may include a main portion 510 and a reference portion 530 protruding from one corner of the main portion 510.

The main portion 510 may illustrate the overall shape of the alignment key 400. The main portion 510 is formed by being patterned in advance in the alignment region 90 of the second substrate 310. In an embodiment, at least three corners of the main portion 510 may have a curved shape, but the shape thereof is not limited thereto, and may have an angled shape. The overall planar shape of the main portion 510 may be a square, but is not limited thereto, and in some embodiments, the main portion 510 may be formed in the shape of a polygon such as a pentagon or hexagon, or may be formed in the shape of a circle.

The reference portion 530 may be disposed to protrude outward from one corner of the main portion 510. The reference portion 530 may be formed as one body with the main portion 510, but may be formed of a different material from the main portion 510. In an example embodiment, the reference portion 530 may be disposed at the upper left corner of the main portion 510 as shown in FIG. 6. However, the disclosure is not limited thereto, and the reference portion 530 may be disposed at any one of the lower left corner, upper right corner, and lower right corner of the main portion 510. Details of the reference portion 530 will be described later.

In an embodiment, the alignment pattern 500 may include an opening 417 formed at the center of the main portion 510. The layer pattern 415 may be disposed in the opening 417 of the alignment pattern 500 to be spaced apart from the main portion 510.

The opening 417 may be disposed at the center of the alignment pattern 500, and may be formed in a rectangular shape corresponding to the shape of the inner side of the main portion 510. The center of the opening 417 may be disposed to coincide with the center of the alignment pattern 500.

The layer pattern 415 may be disposed in the opening 417 of the alignment pattern 500, and may be formed in a rectangular shape similar to the shape of the opening 417. The layer pattern 415 may be spaced apart from the main portion 510, and may be disposed at the center of the main portion 510. The layer pattern 415 may be surrounded by the main portion 510.

The opening 417 may be disposed in an area where the main portion 510 is spaced apart from the layer pattern 415. The opening 417 may be an area where the center of the main portion 510 is opened. The layer pattern 415 may be spaced apart from the main portion 510 and disposed in the opening 417. The layer pattern 415 may be formed at the same time when the layer of the color conversion substrate 30 is formed after the alignment pattern 500 and the opening 417 are formed.

Specifically, the layer pattern 415 may be formed of the same material as the layer of any one of the first color filter, light blocking member, second color filter, third color filter, light transmitting pattern, first wavelength conversion pattern, second wavelength conversion pattern, and color mixing prevention member of the above-described color conversion substrate 30. The layer pattern 415 may be a pattern formed simultaneously in the same process as each layer when the layer of any one of the first color filter, light blocking member, second color filter, third color filter, light transmitting pattern, first wavelength conversion pattern, second wavelength conversion pattern, and color mixing prevention member of the color conversion substrate 30 is formed.

As shown in FIGS. 6 and 7, when the first alignment key 410 is provided with the layer pattern 415, the alignment degree of the layer pattern 415 may be determined by measuring the first distance d1 which measures from one side edge of the main portion 510 to one side egde of the layer pattern 415 and the second distance d2 which measures from the other side edge of the main portion 510 to the other side edge of the layer pattern 415.

Referring to FIGS. 5 and 6, in an embodiment, the alignment pattern 500 may include at least one sub-protrusion portion 550. The sub-protrusion portion 550 may have a shape protruding from at least one corner of the main portion 510 of the alignment pattern 500. The sub-protrusion portion 550 may be formed in the same process when forming the main portion 510 of the alignment pattern 500. In some embodiments, the sub-protrusion portion 550 may be formed in a separate process. For example, the sub-protrusion portion 550 may be formed by patterning in the corresponding layer process when forming the layer pattern 415.

In order to describe a position in which the sub-protrusion portion 550 may be disposed as shown in FIG. 5, as shown in FIG. 6, three corner regions of the main portion 510 are divided into from first region to sixth region PT1, PT2, PT3, PT4, PT5, and PT6 and are illustrated by dotted lines.

Referring to FIGS. 6 and 8, 9, 10, 11, 12, 13, 14, 15, 16, and 17, when the sub-protrusion portion 550 is disposed in the first region PT1, it may be referred to as a first protrusion portion 551, when the sub-protrusion portion 550 is disposed in the second region PT2, it may be referred to as a second sub-protrusion portion 552, when the protrusion portion 550 is disposed in the third region PT3, it may be referred to as a third sub-protrusion portion 553, when the protrusion portion 550 is disposed in the fourth region PT4, it may be referred to as a fourth sub-protrusion portion 554, when the protrusion portion 550 is disposed in the fifth region PT5, it may be referred to as a fifth sub-protrusion portion 555, and when the protrusion portion 550 is disposed in the sixth region PT6, it may be referred to as a sixth sub-protrusion portion 556. In an embodiment, when the alignment key 400 is viewed from a top plan, the first region to the sixth region PT1, PT2, PT3, PT4, PT5, and PT6 are named clockwise from the upper right, but in some embodiments, they may be named counterclockwise from the upper right.

The main portion 510 may include two pairs of two sides facing each other. Specifically, the main portion 510 may include a first side 511 corresponding to the upper side and a second side 512 corresponding to the lower side. The first side 511 and the second side 512 may be arranged to face each other in parallel. The main portion 510 may include a third side 513 corresponding to the left side and a fourth side 514 corresponding to the right side. Each of the third side 513 and the fourth side 514 may intersect the first side 511 or the second side 512. The third side 513 and the fourth side 514 may be arranged to face each other in parallel.

The first region PT1 may be a region protruding from the first side 511 of the main portion 510 in the first direction DR1. The first direction DR1 may be one direction in which the third side 513 or the fourth side 514 extends. The first region PT1 may be disposed adjacent to the fourth side 514. The second region PT2 may be a region protruding from the fourth side 514 of the main portion 510 in the second direction DR2 and disposed adjacent to the first side 511. The second direction DR2 may be one direction in which the first side 511 or the second side 512 extends. The third region PT3 may be a region protruding from the fourth side 514 of the main portion 510 in the second direction DR2 and disposed adjacent to the second side 512. The fourth region PT4 may be a region protruding from the second side 512 of the main portion 510 in the third direction DR3 and disposed adjacent to the fourth side 514. The third direction DR3 may be the other direction in which the third side 513 or the fourth side 514 extends. The fifth region PT5 may be a region protruding from the second side 512 of the main portion 510 in the third direction DR3 and disposed adjacent to the third side 513. The sixth region PT5 may be a region protruding from the third side 513 of the main portion 510 in the fourth direction DR4 and disposed adjacent to the second side 512. The fourth direction DR4 may be the opposite direction in which the first side 511 or the second side 512 extends.

At least one protrusion portion 550 may be disposed in the first region PT1 to the sixth region PT6 for each alignment key 400, and it may be determined what layer is formed on the layer pattern 415 depending on the position of the protrusion portion 550. For example, the layer pattern 415 of the same material as the layer of the preset color conversion substrate 30 may be formed in the first alignment key 410 in which the protrusion portion 550 is disposed in the first region PT1. Therefore, it is possible to determine what layer is formed on the layer pattern 415 when seeing the arrangement of the protrusion portion 550 of the first alignment key 410.

In an embodiment, the arrangements of the protrusion portions 550 in the alignment key 400 may indicate a process order. The arrangements of the protrusion portions 550 may be based on the binary method.

Referring to FIG. 6, the first region PT1 may represent a site of the 0th power of 2 in binary number, and the second region PT2 may represent a site of the 1st power of 2 in binary number. The third region PT3 may represent a site of the 2nd power of 2 in binary number, and the fourth region PT4 may represent a site of the 3rd power of 2 in binary number. The fifth region PT5 may represent a site of the 4th power of 2 in binary number, and the sixth region PT6 may represent a site of the 5th power of 2 in binary number. When the protrusion portion 550 is disposed in each of the first region PT1 to the sixth region PT6, a binary number of 1 may be represented, and when the protrusion portion 550 is not disposed in each of the first region PT1 to the sixth region PT6, a binary number of 0 may be represented.

Figure 8:
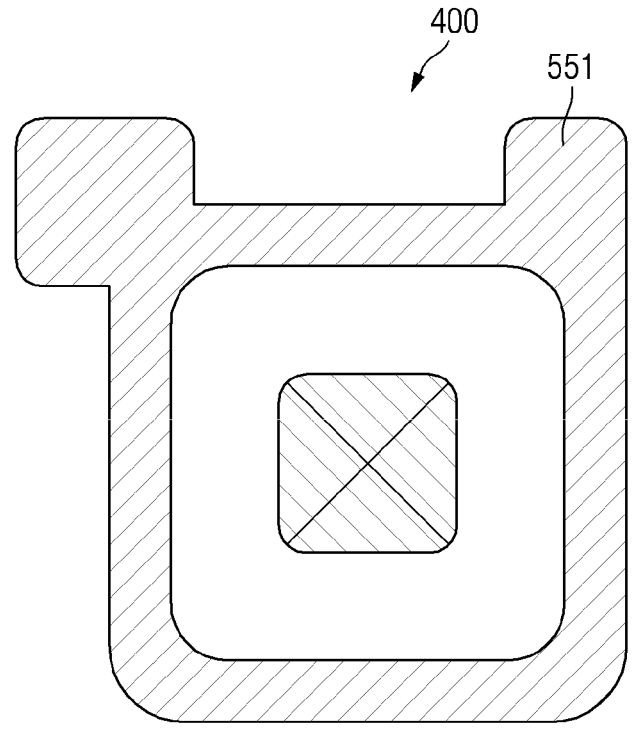
FIGS. 8, 9, 10, 11, 12, 13, 14, 15, 16, and 17 are plan views showing various example structures of the alignment key.
Figure 9:
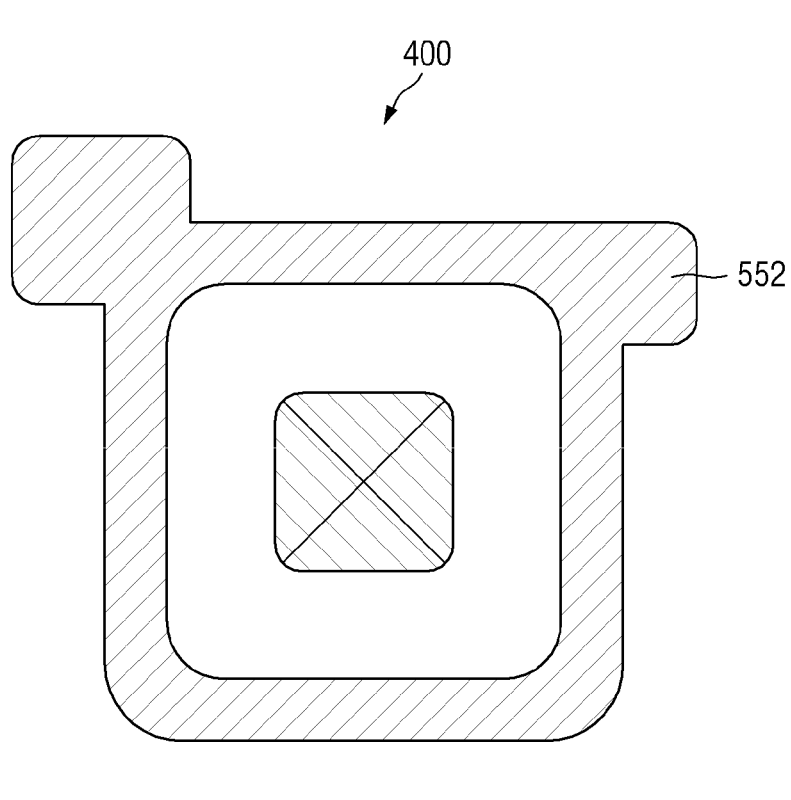
Figure 10:
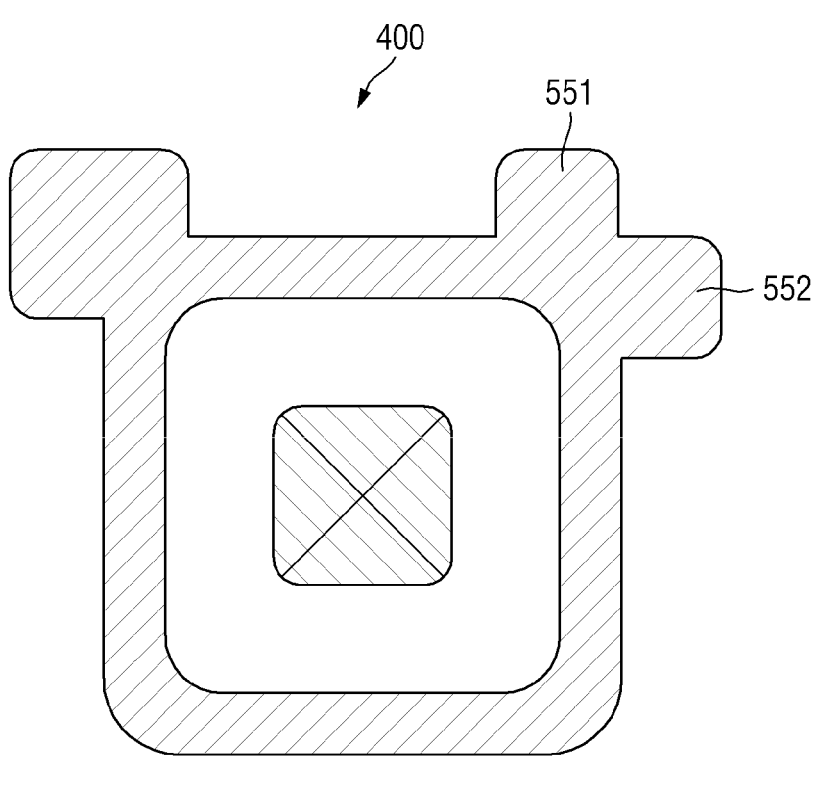
Figure 11:
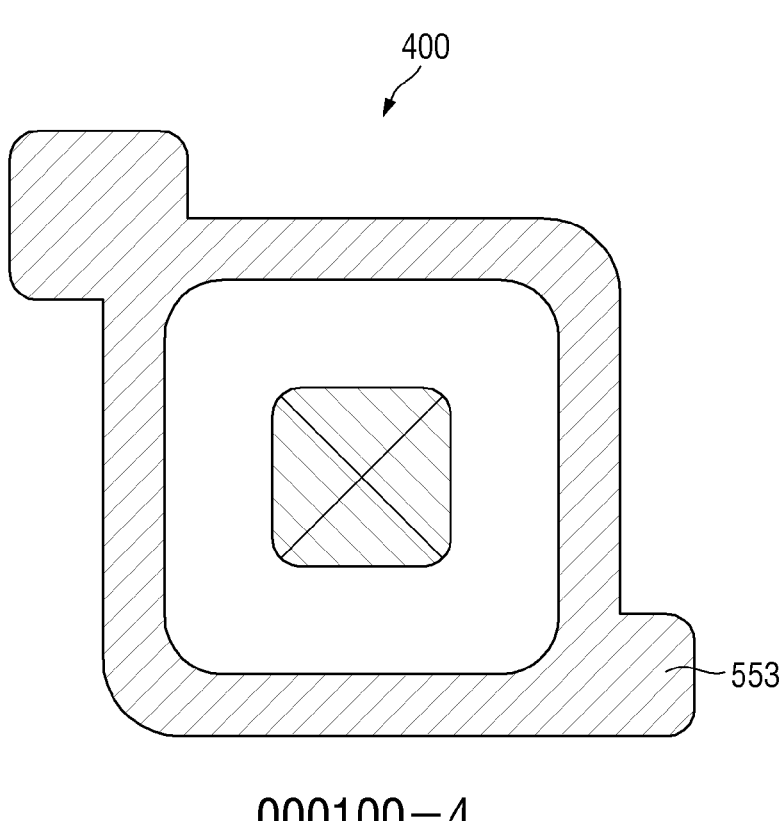
Figure 12:
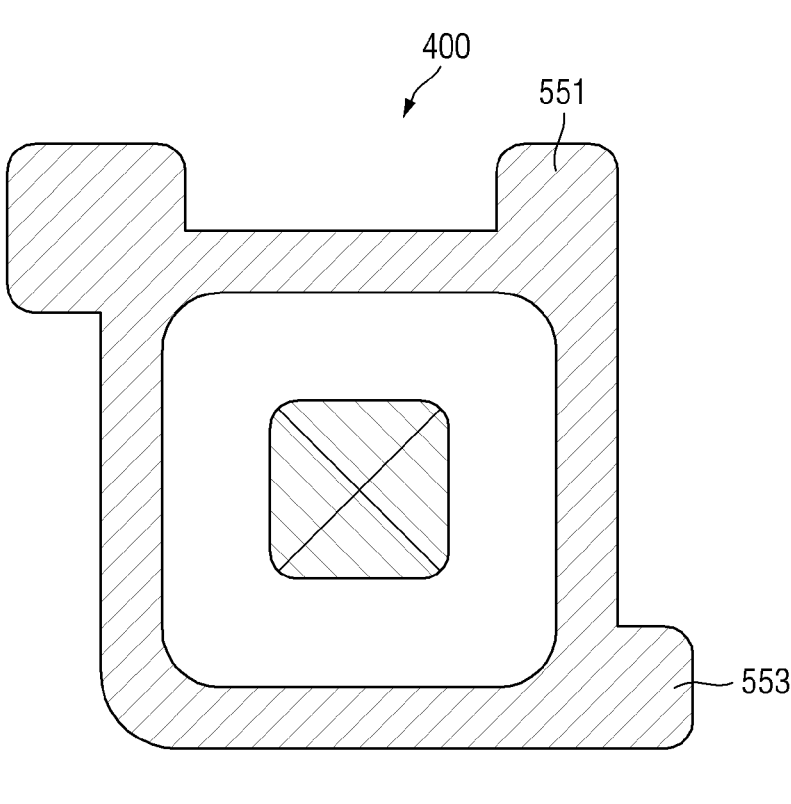

Referring to FIGS. 8, 9, 10, 11, 12, 13, 14, 15, 16, and 17, when the alignment key 400 is provided with only the first sub-protrusion portion 551, a binary number of 000001 is represented, so that a decimal number of 1 may be represented (FIG. 8). When the alignment key 400 is provided with only the second sub-protrusion portion 552, a binary number of 000010 is represented, so that a decimal number of 2 may be represented (FIG. 9). When the alignment key 400 is provided with the first sub-protrusion portion 551 and the second sub-protrusion portion 552, a binary number of 000011 is represented, so that a decimal number of 3 may be represented (FIG. 10). When the alignment key 400 is provided with the third sub-protrusion portion 553, s binary number of 000100 is represented, so that a decimal number of 4 may be represented (FIG. 11). When the alignment key 400 is provided with the first sub-protrusion portion 551 and the third sub-protrusion portion 553, a binary number of 000101 is represented, so that a decimal number of 5 may be represented (FIG. 12).

Figure 13:
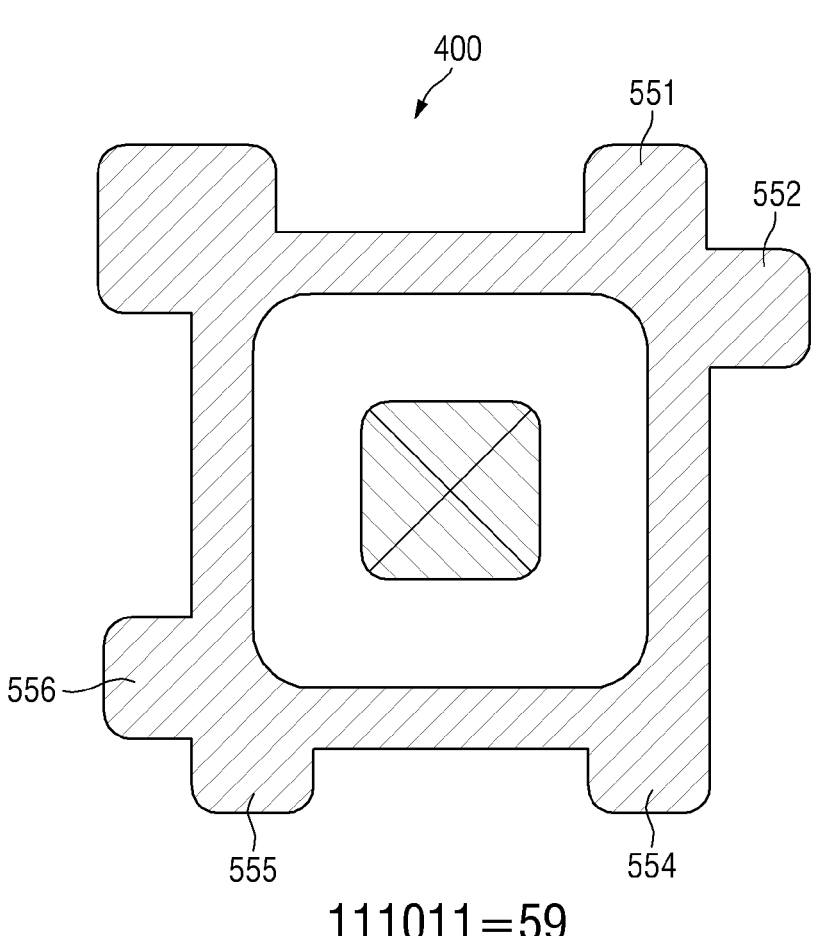
Figure 14:
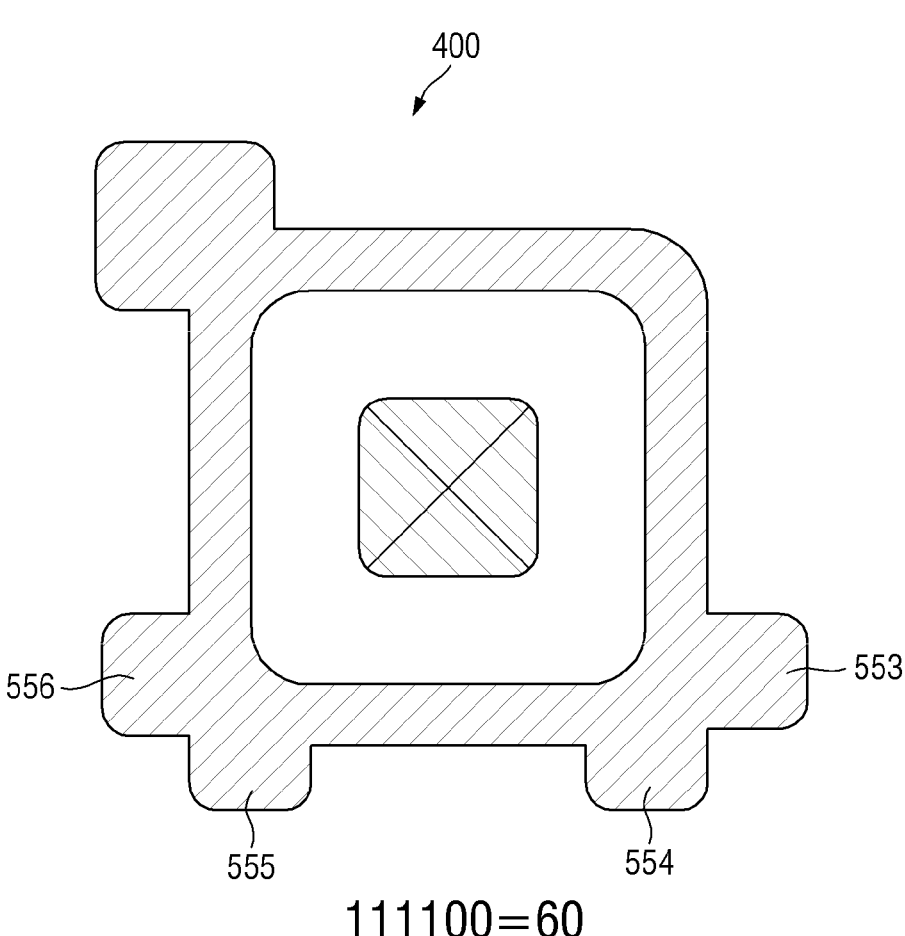
Figure 15:
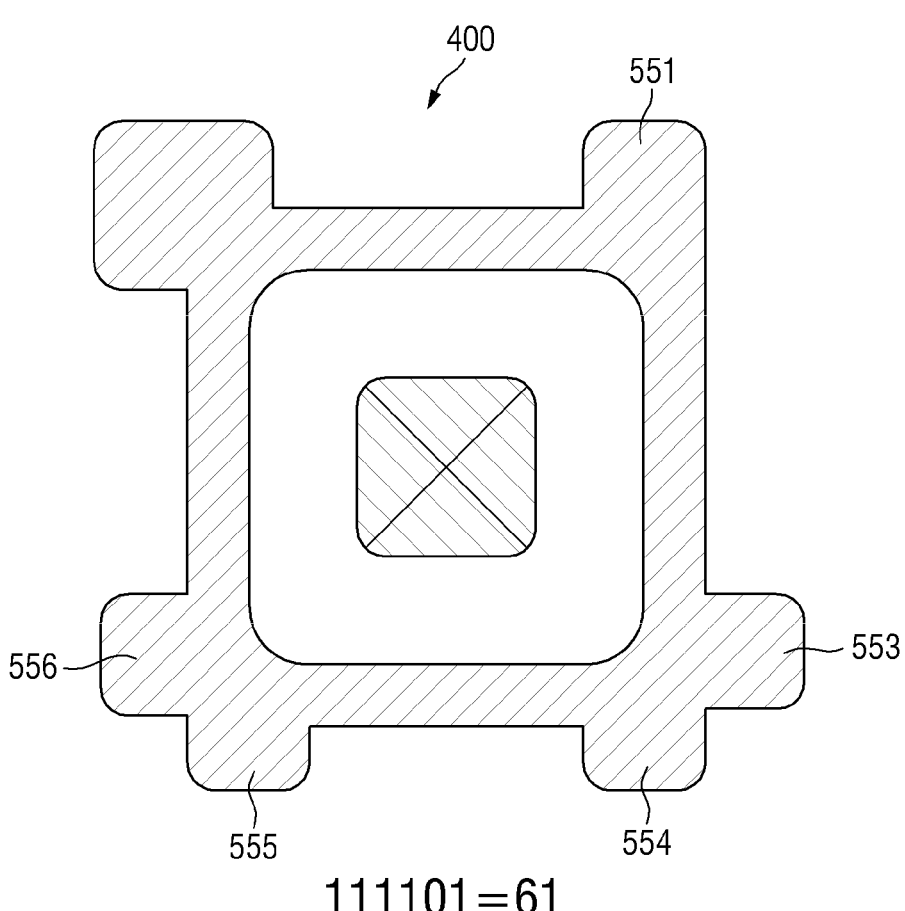
Figure 16:
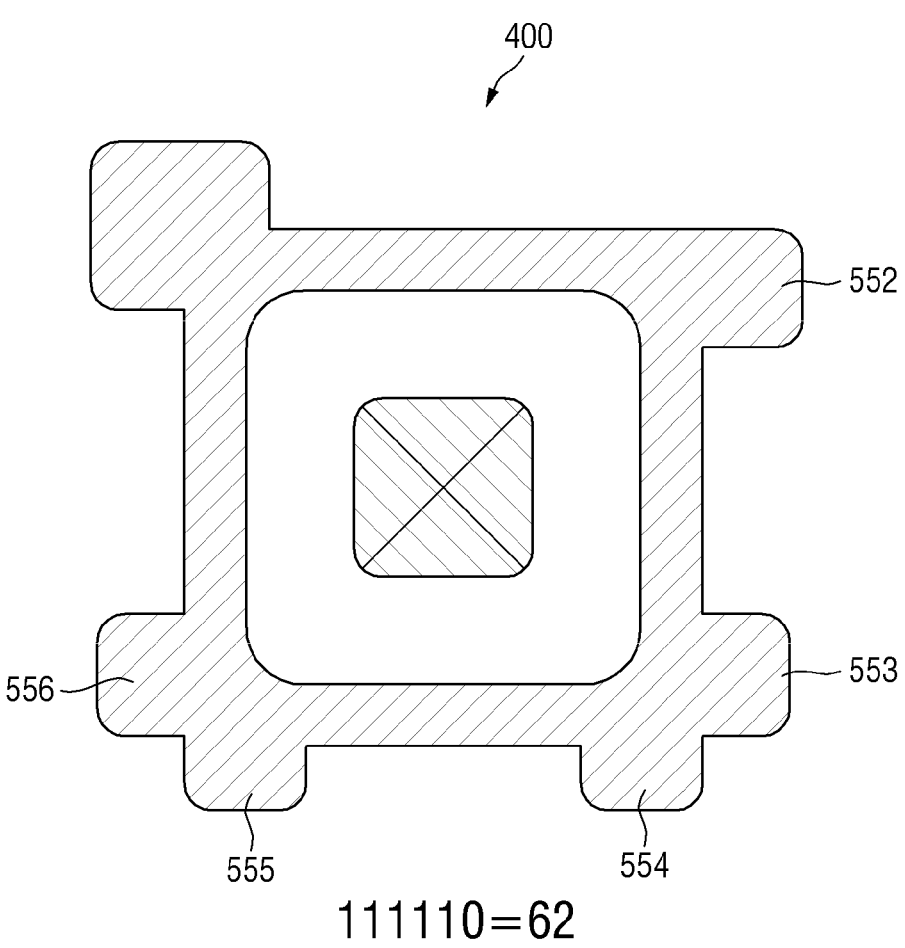
Figure 17:
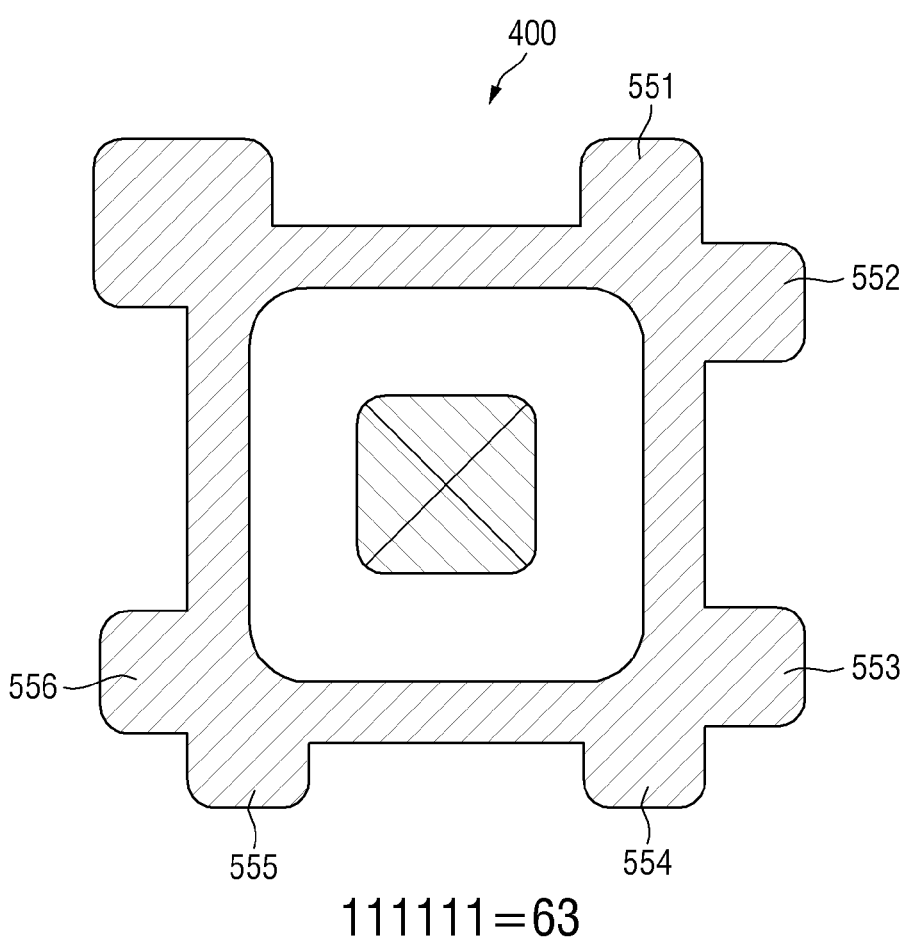

In this way, when the alignment key 400 is provided with the first sub-protrusion portion 551, the second sub-protrusion portion 552, the fourth sub-protrusion portion 554, the fifth sub-protrusion portion 555, and the sixth sub-protrusion portion 556, a binary number of 111011 is represented, so that a decimal number of 59 may be represented (FIG. 13). When the alignment key 400 is provided with the third sub-protrusion portion 553, the fourth sub-protrusion portion 554, the fifth sub-protrusion portion 555 and the sixth sub-protrusion portion 556, a binary number of 111100 is represented, so that a decimal number of 60 may be represented (FIG. 14). When the alignment key 400 is provided with the first sub-protrusion portion 551, the third sub-protrusion portion 553, the fourth sub-protrusion portion 554, the fifth sub-protrusion portion 555 and the sixth sub-protrusion portion 556, a binary number of 111101 is represented, so that a decimal number of 61 may be represented (FIG. 15). When the alignment key 400 is provided with the second sub-protrusion portion 552, the third sub-protrusion portion 553, the fourth sub-protrusion portion 554, the fifth sub-protrusion portion 555 and the sixth sub-protrusion portion 556, a binary number of 111110 is represented, so that a decimal number of 62 may be represented. Further, when the alignment key 400 is provided with the first sub-protrusion portion 551, the second sub-protrusion portion 552, the third sub-protrusion portion 553, the fourth sub-protrusion portion 554, the fifth sub-protrusion portion 555 and the sixth sub-protrusion portion 556, a binary number of 111111 is represented, so that a decimal number of 63 may be represented.

As described above, in the alignment key 400 according to an embodiment, the protrusion portions 550 may be variously disposed in the first region PT1 to the sixth region PT6 to represent decimal numbers of 1 to 63. Thus, the arrangement of the protrusion portions 550 of the alignment key 400 may be easily checked for the number of steps.

Meanwhile, in an embodiment, the alignment key 400 may be provided with the reference portion 530. When measuring alignment degree through the alignment key 400, when a camera observing the alignment key 400 is rotated, for example, when the camera is rotated to 90°, the image of the alignment key 400 may be rotated to 90°. In this case, it is difficult to know whether the arrangement of the protrusion portion 550 is the first region PT1, the third region PT3, or the fifth region PTS. Therefore, in an embodiment, when the reference portion 530 protruding from any one corner of the alignment key 400 is disposed, the protrusion portion 550 may correspond to the first region PT1 to the sixth region PT6 in order from the position arranged in the clockwise direction with respect to the reference portion 530 to be easily distinguishable.

Referring to FIGS. 18, 19, and 20, the reference portion 530 of the alignment key 400 may have various shapes and arrangements. For example, the reference portion 530 may protrude from the first side 511 of the main portion 510 in the first direction DR1, and may be disposed adjacent to a corner where the first side 511 and third side 513 of the main portion 510 meet each other (FIGS. 18 and 19). For another example, the reference portion 530 may protrude in a direction between the first direction DR1 and the fourth direction DR4 at an edge where the first side 511 and third side 513 of the main portion 510 meet each other. The reference portion 530 may be formed in any shape such as a polygon (tetragon or pentagon) or a circle.

Further, the reference portion 530 may be formed in a planar shape different from the protrusion portion 550. In another embodiment, the reference portion 530 may be formed in the same planar shape as the protrusion portion 550, and in this case, the reference portion 530 may be formed in different plane areas to be distinguished from the protrusion portion 550.

Referring to FIG. 19, the layer pattern 415 may include two pairs of two outer sides facing each other. Specifically, the layer patterns 415 may include a first outer side 496 and a second outer side 497 extending in the second direction DR2 and facing each other, and may include a third outer side 498 and a fourth outer side 499 extending in the first direction DR1 and facing each other.

Here, a partition region PP may be formed by imaginary extension lines from EL1 to EL4 respectively from the first outer side 496, the second outer side 497, the third outer side 498, and the fourth outer side 499. The first imaginary extension line EL1 of the first outer side 496, the second imaginary extension line EL2 of the second outer side 497, the third imaginary extension line EL3 of the third outer side 498, and the fourth outer side 499 of the fourth imaginary extension line EL4 may be disposed. The partition region PP may be a cross-shaped region partitioned by each of the imaginary extension lines from EL1 to EL4.

In an embodiment, the reference portion 530 and the first sub-protrusion portion 551 may not overlap the partition region PP.

Referring to FIG. 18, when measuring the arrangement degree of the alignment key 400 and the layer pattern 415, the distance d3 between the inner side AA of the center of the first side 511 of the main portion 510 and the center BB of the first outer side 496 facing the first side 511 of the main portion 510 is measured. These distances d3 may be directly disposed in the partition region PP. In this case, when the reference portion 530 or the first sub-protrusion portion 551, protruding in the first direction DR1 from the center of the first side 511 of the main portion 510, is disposed, in the alignment degree measuring apparatus, the outline of the reference portion 530 or the first sub-protrusion portion 551is recognized, and thus it may be difficult to measure the distance d3. Therefore, the reference portion 530 or the first sub-protrusion portion 551 may be disposed not to overlap the partition region PP, thereby improving the accuracy of measurement of alignment degree.

Referring back to FIG. 5, the plurality of alignment keys 410, 420, 430, 440, 450, 460, 470, and 480 may include sub-protrusion portions 550 arranged at different positions. The first to eighth alignment keys 410, 420, 430, 440, 450, 460, 470, and 480 may be disposed in the alignment region 90 of the color conversion substrate 30, corresponding to the color conversion substrate 30 including eight layers. As described above, in the first to eighth alignment keys 410, 420, 430, 440, 450, 460, 470, and 480, which layer will be formed corresponding to the eight layers of the color conversion substrate 30 is previously set.

In an embodiment, in the color conversion substrate 30, the first color filter 231, the light blocking member 220, the second color filter 233, the third color filter 235, the light transmitting pattern 330, the first wavelength conversion pattern 340, the second wavelength conversion pattern 350, and the color mixing prevention member 370 may be sequentially formed.

Specifically, referring to FIGS. 5 and 6, since the first alignment key 410 including the first protrusion portion 551 formed in the first region PT1 represents a binary number of 000001, which is a decimal number of 1, the layer pattern 415 may be formed of the same material as the first color filter 231 through the first mask process. Since the second alignment key 420 including the second protrusion portion 552 formed in the second region PT1 represents a binary number of 000010, which is a decimal number of 2, the layer pattern 415 may be formed of the same material as the light blocking member 220 through the second mask process. Since the third alignment key 430 including the first sub-protrusion portion 551 formed in the first region PT1 and the second sub-protrusion portion 552 formed in the second region PT2 represents a binary number 000011, which is a decimal number of 3, the layer pattern 415 may be formed of the same material as the second color filter 233 through the third mask process. Since the fourth alignment key 440 including the third sub-protrusion portion 553 formed in the third region PT3 represents a binary number 000100, which is a decimal number of 4, the layer pattern 415 may be formed of the same material as the third color filter 235 through the fourth mask process. Since the fifth alignment key 450 including the first sub-protrusion portion 551 formed in the first region PT1 and the third sub-protrusion portion 553 formed in the third region PT3 represents a binary number 000101, which is a decimal number of 5, the layer pattern 415 may be formed of the same material as the light transmitting pattern 330 through the fifth mask process. Since the sixth alignment key 460 including the second sub-protrusion portion 552 formed in the second region PT2 and the third sub-protrusion portion 553 formed in the third region PT3 represents a binary number 000110, which is a decimal number of 6, the layer pattern 415 may be formed of the same material as the first wavelength conversion pattern 340 through the sixth mask process. Since the seventh alignment key 470 including the second sub-protrusion portion 552 formed in the second region PT2 and the third sub-protrusion portion 553 formed in the third region PT3 represents a binary number of 000111, which is a decimal number of 7, the layer pattern 415 may be formed of the same material as the second wavelength conversion pattern 350 through the seventh mask process. Since the eighth alignment key 480 including the fourth sub-protrusion portion 554 formed in the fourth region PT4 represents a binary number of 001000, which is a decimal number of 8, the layer pattern 415 may be formed of the same material as the color mixing prevention member 370 through the eighth mask process.

Accordingly, alignment degree of the first color filter 231, the light blocking member 220, the second color filter 233, the third color filter 235, the light transmitting pattern 330, the first wavelength conversion pattern 340, the second wavelength conversion pattern 350, and the color mixing prevention member 370 may be measured through the layer patterns 415 of the first to eighth alignment keys 410, 420, 430, 440, 450, 460, 470, and 480, respectively. That is, even when the plurality of alignment keys 410 are provided with the layer patterns 415 having the same shape and size, respectively, which layer is formed on the color conversion substrate according to the position of the protrusion portion in the alignment key may be immediately checked. Accordingly, the corresponding layer forming process may be immediately corrected, thereby improving the reliability and accuracy of the manufacturing process.

Hereinafter, the structures of the layers and alignment keys formed corresponding to the manufacturing process of the color conversion substrate according to an embodiment will be described for each process.

Figure 21:
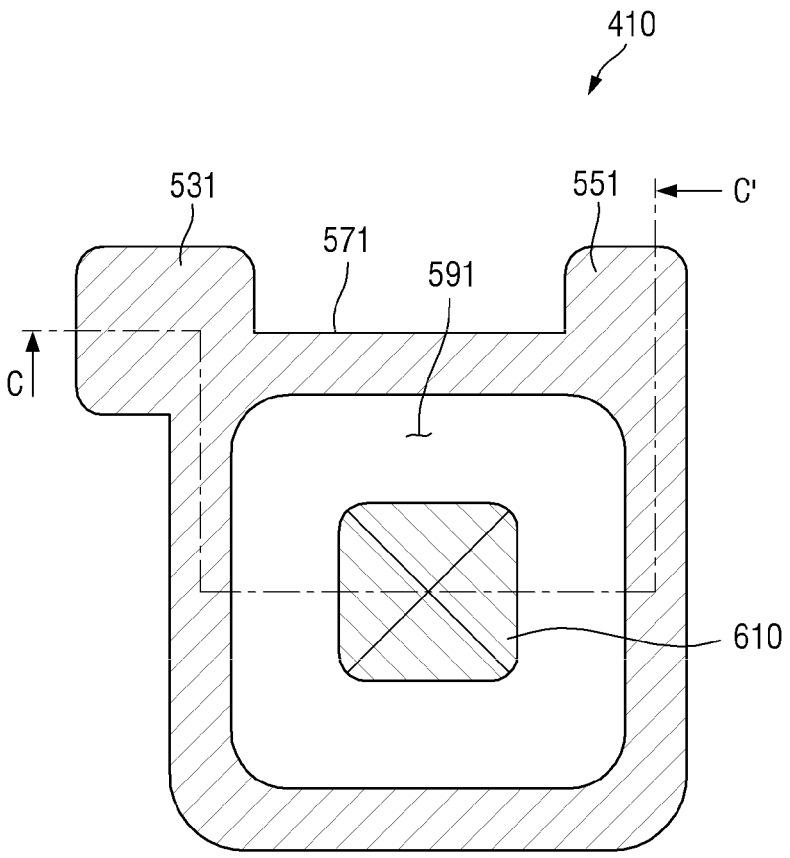
FIG. 21 is a schematic plan view of a first alignment key according to an embodiment.
Figure 22:
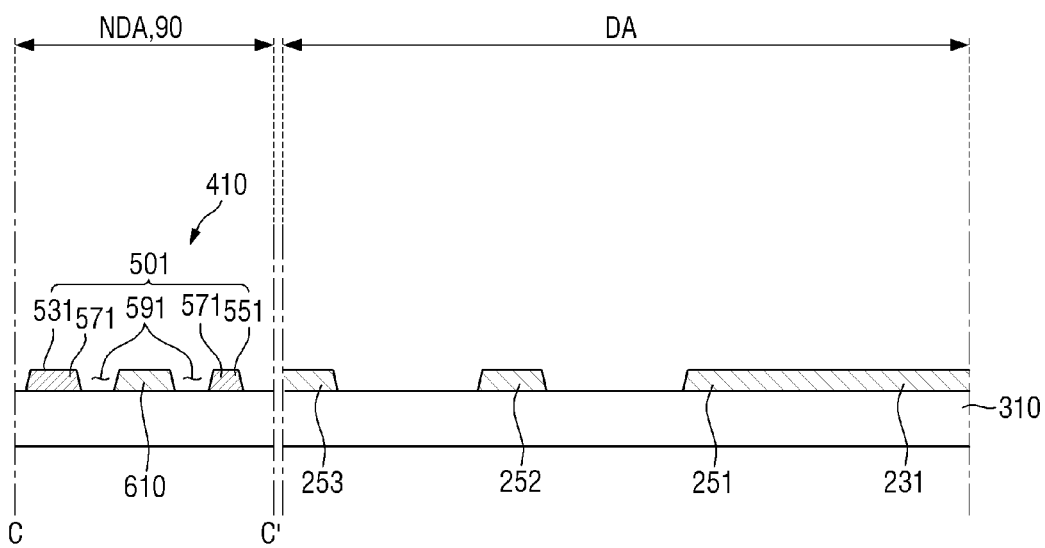
FIG. 22 is a cross-sectional view of a color conversion substrate taken along line C-C' in FIG. 21 according to an embodiment.
Figure 23:
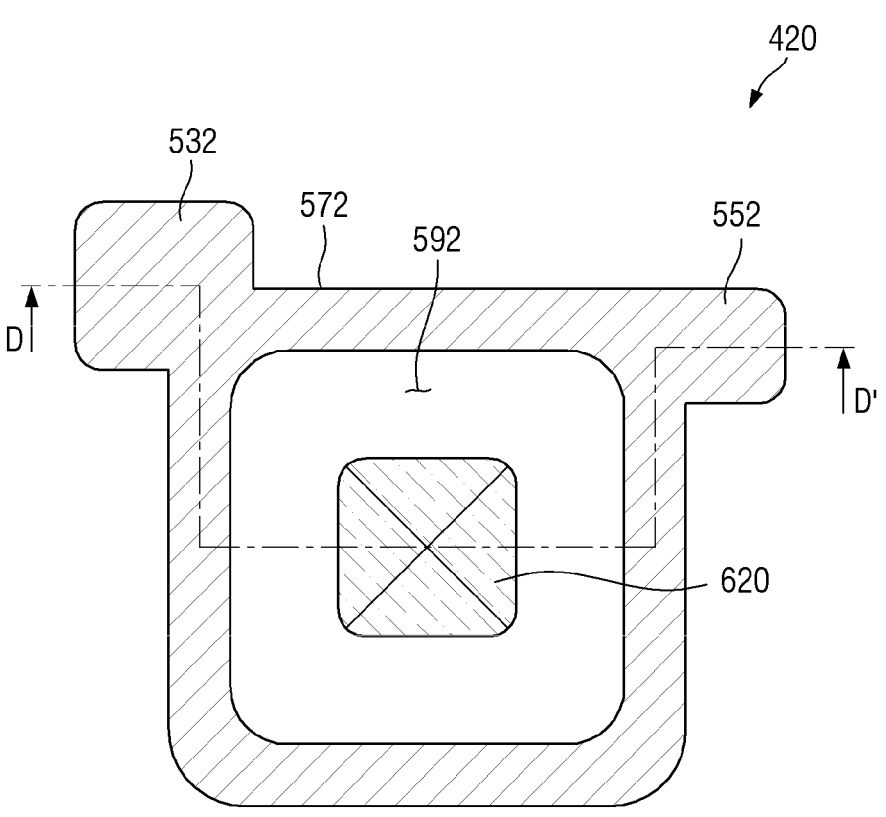
FIG. 23 is a schematic plan view of a second alignment key according to an embodiment.
Figure 24:
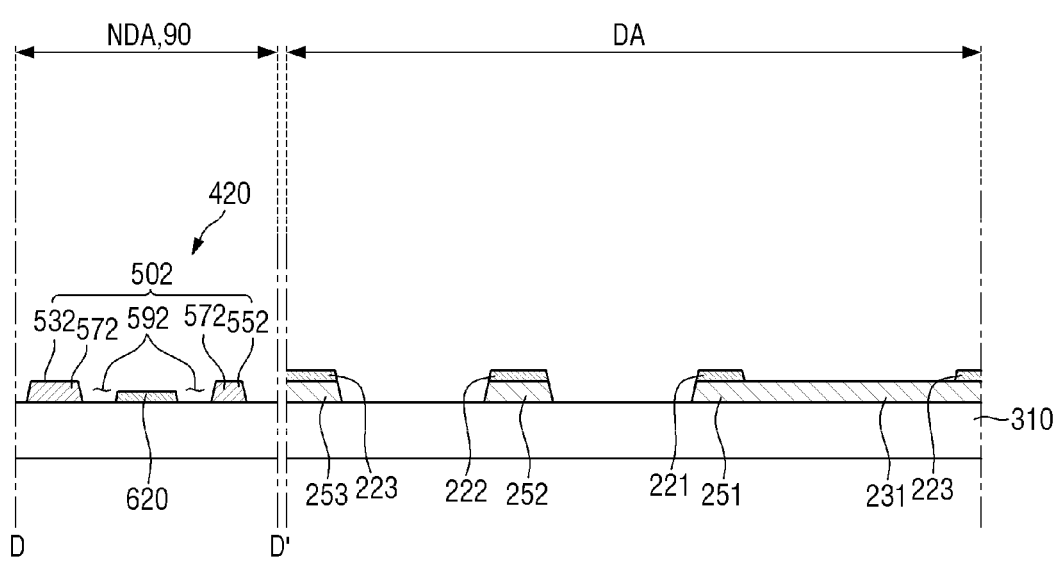
FIG. 24 is a cross-sectional view of a color conversion substrate taken along line D-D' in FIG. 23 according to an embodiment.
Figure 25:
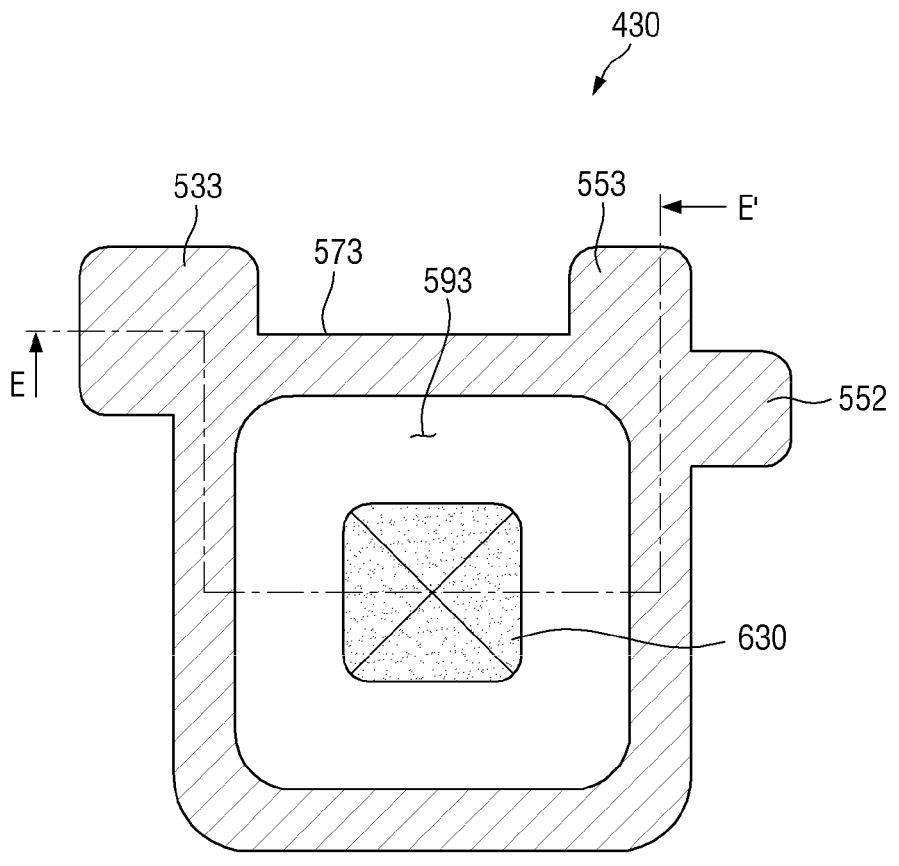
FIG. 25 is a schematic plan view of a third alignment key according to an embodiment.
Figure 26:
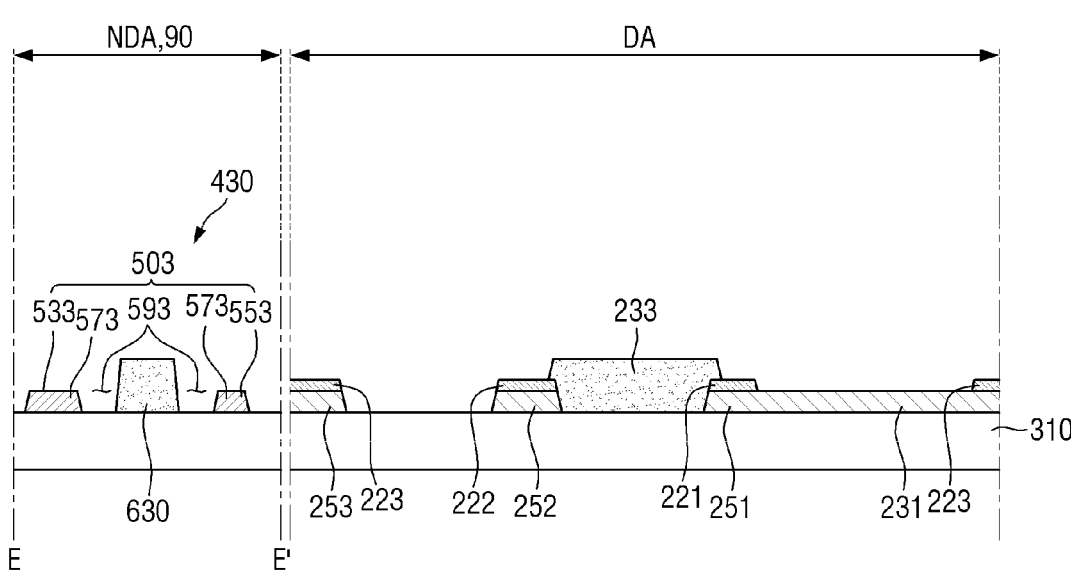
FIG. 26 is a cross-sectional view of a color conversion substrate taken along line E-E' in FIG. 25 according to an embodiment.
Figure 27:
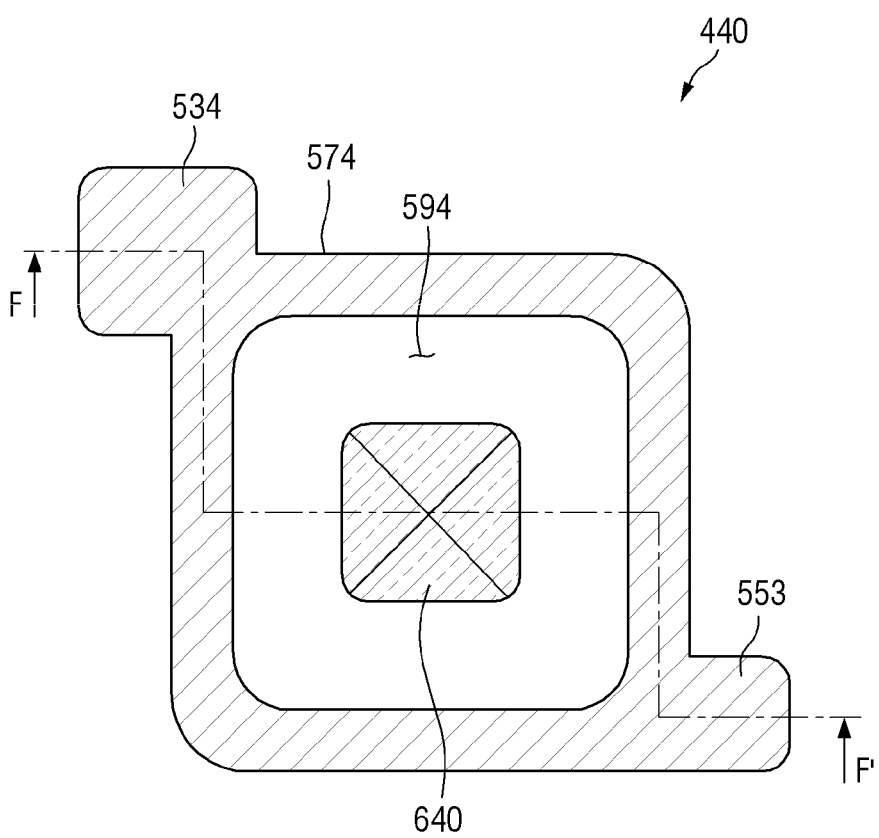
FIG. 27 is a schematic plan view of a fourth alignment key according to an embodiment.
Figure 28:
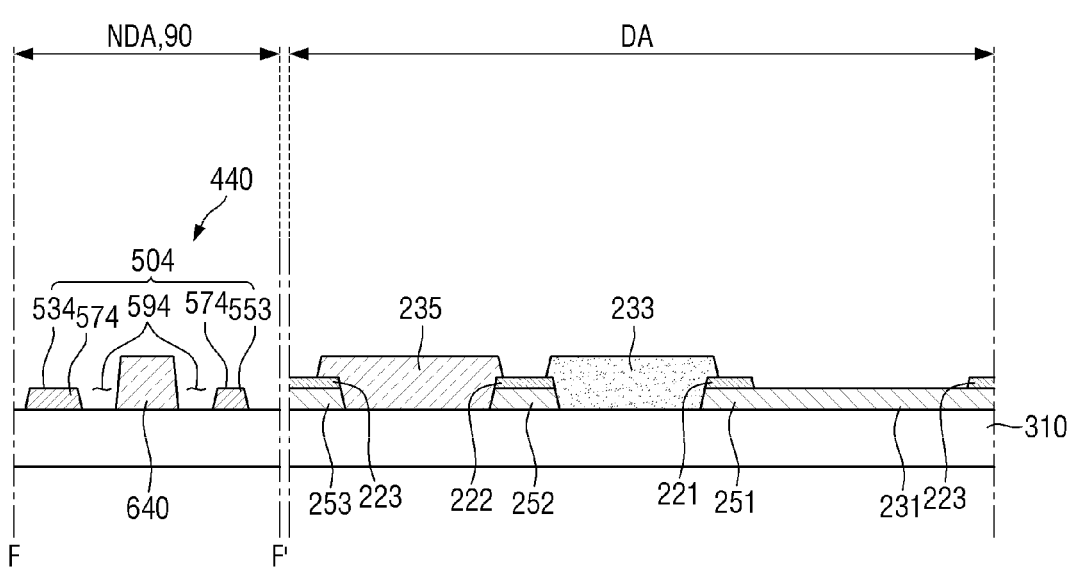
FIG. 28 is a cross-sectional view of a color conversion substrate taken along line F-F' in FIG. 27 according to an embodiment.
Figure 29:
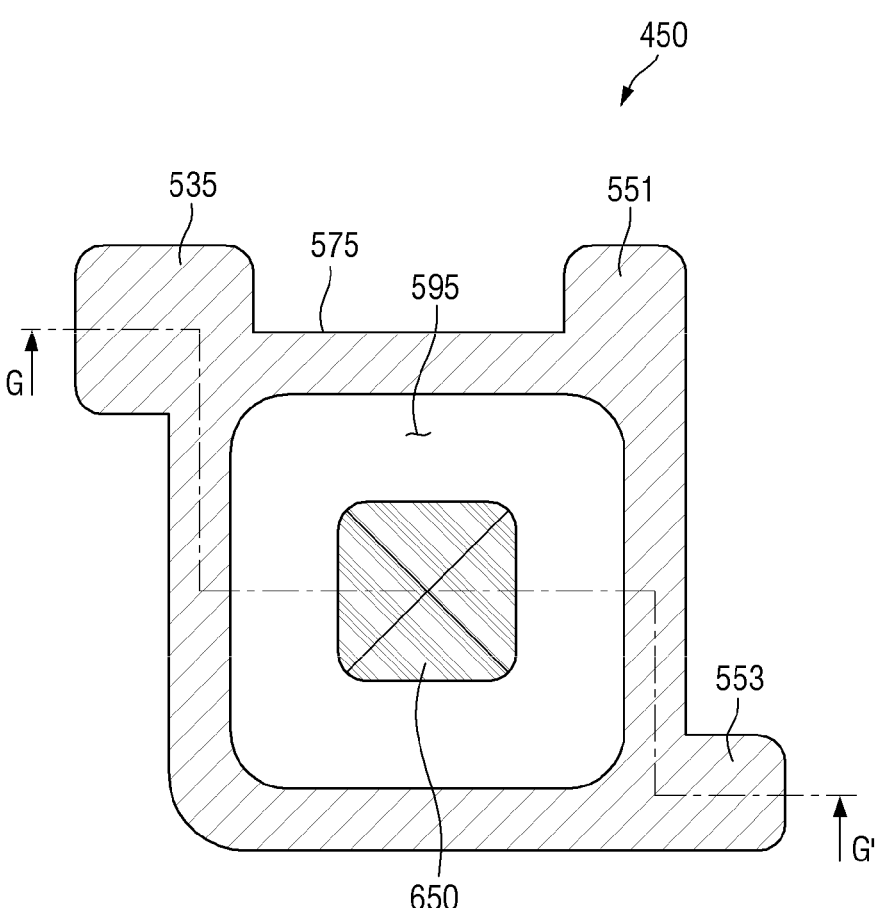
FIG. 29 is a schematic plan view of a fifth alignment key according to an embodiment.
Figure 30:
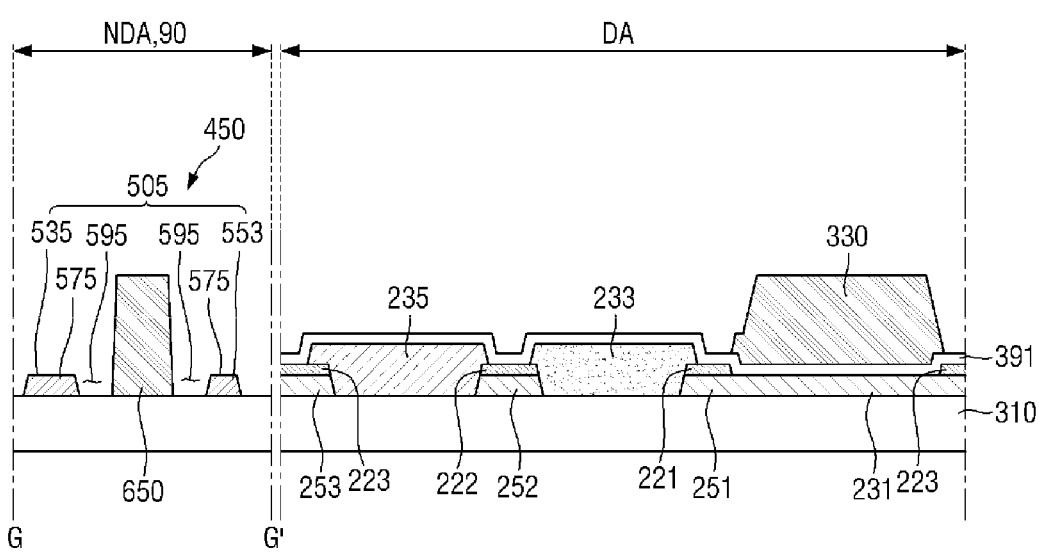
FIG. 30 is a cross-sectional view of a color conversion substrate taken along line G-G' in FIG. 29 according to an embodiment.
Figure 31:
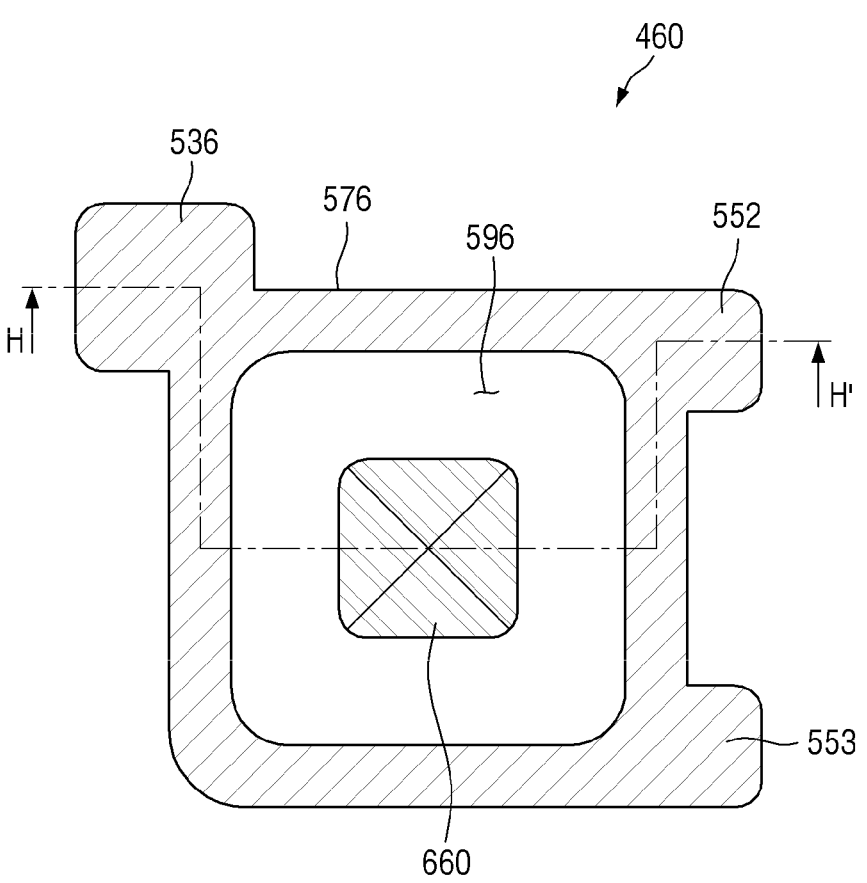
FIG. 31 is a schematic plan view of a sixth alignment key according to an embodiment.
Figure 32:
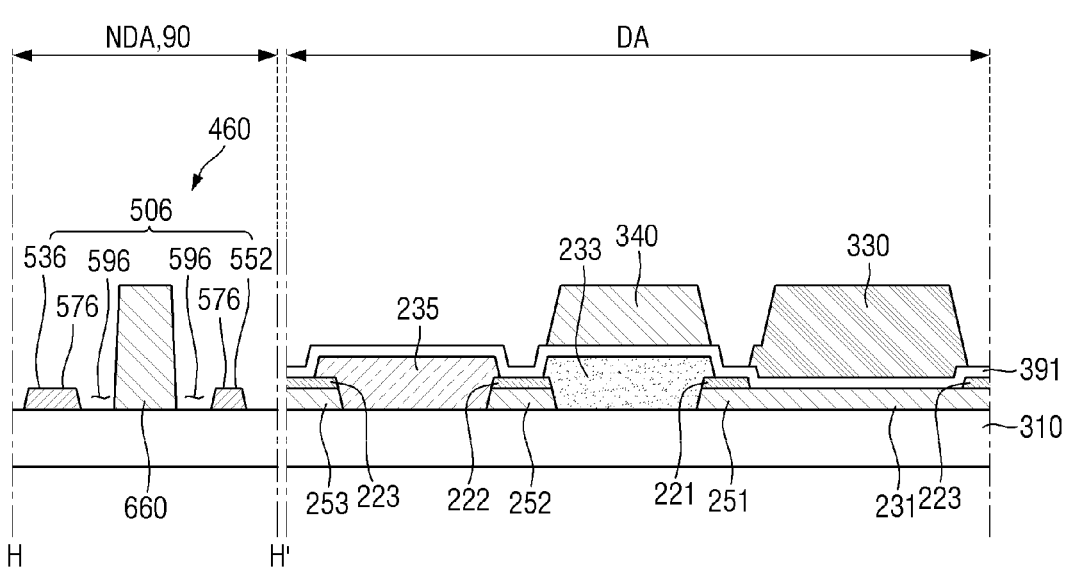
FIG. 32 is a cross-sectional view of a color conversion substrate taken along line H-H' in FIG. 31 according to an embodiment.
Figure 33:
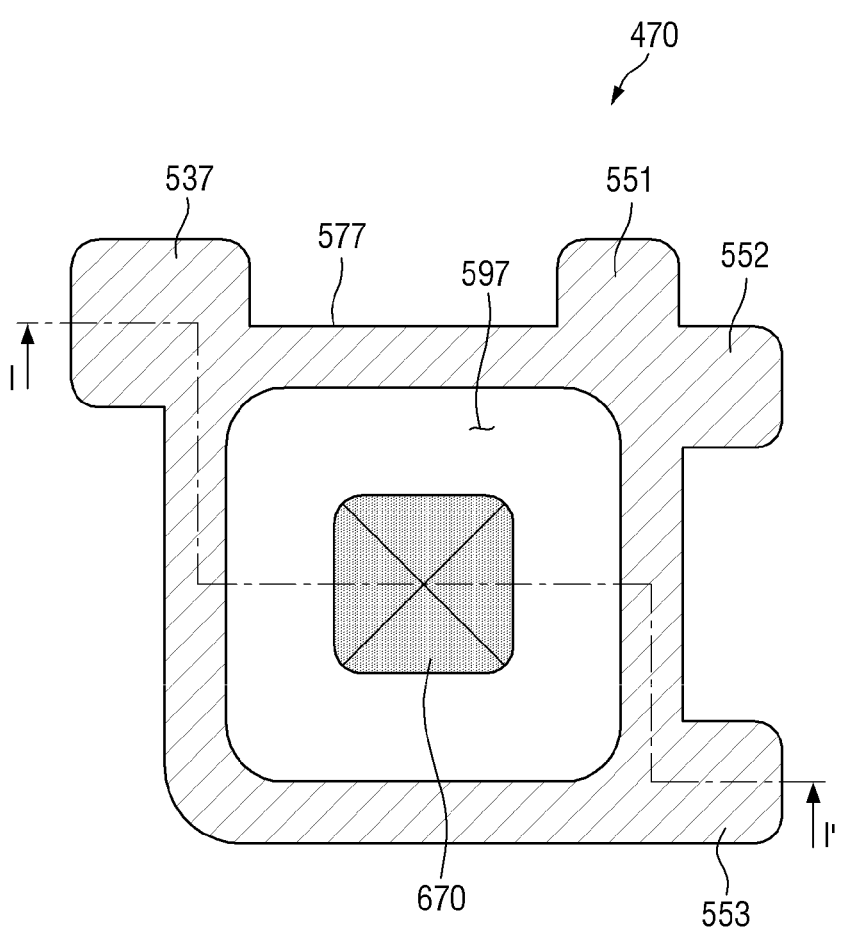
FIG. 33 is a schematic plan view of a seventh alignment key according to an embodiment.
Figure 34:
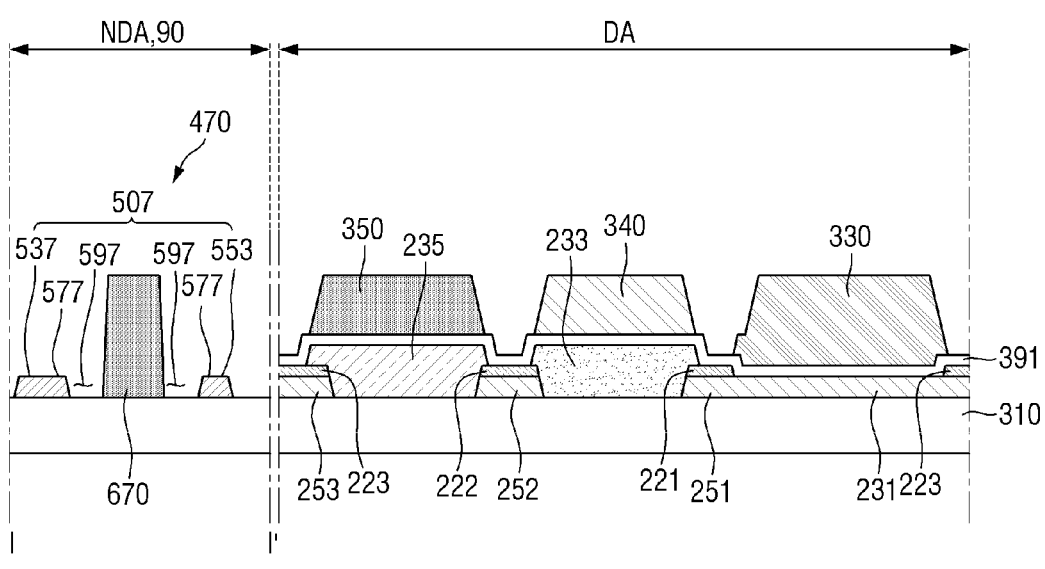
FIG. 34 is a cross-sectional view of a color conversion substrate taken along line I-I' in FIG. 33 according to an embodiment.
Figure 35:
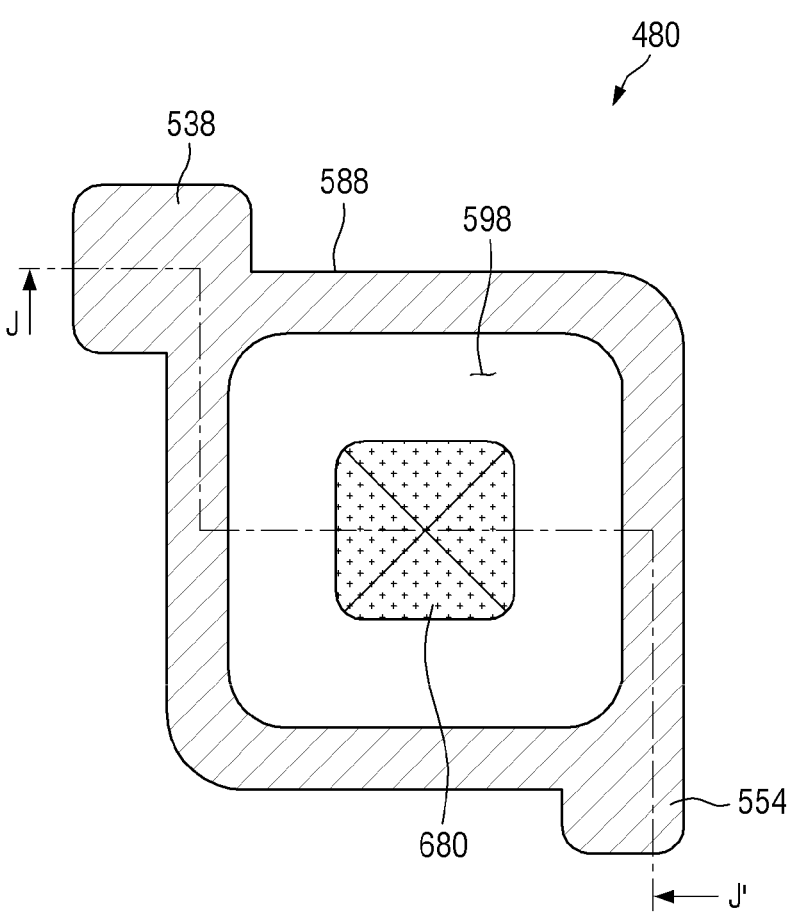
FIG. 35 is a schematic plan view of a eighth alignment key according to an embodiment.
Figure 36:
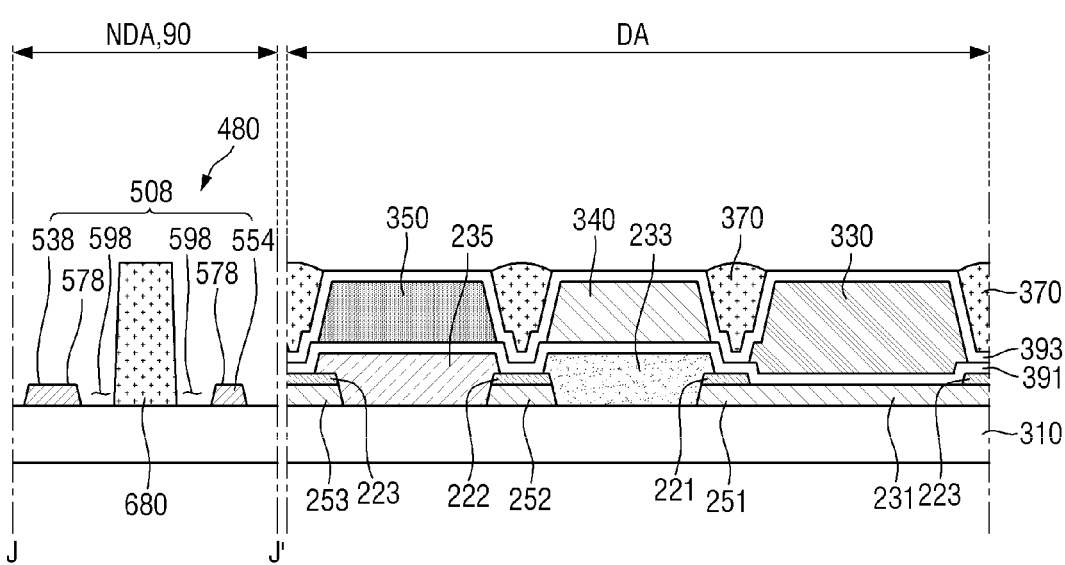
FIG. 36 is a cross-sectional view of a color conversion substrate taken along line J-J' in FIG. 35 according to an embodiment.

FIG. 21 is a schematic plan view of a first alignment key according to an embodiment, FIG. 22 is a cross-sectional view of a color conversion substrate taken along line C-C' in FIG. 21 according to an embodiment, FIG. 23 is a schematic plan view of a second alignment key according to an embodiment,. FIG. 24 is a cross-sectional view of a color conversion substrate taken along line D-D' in FIG. 23 according to an embodiment, FIG. 25 is a schematic plan view of a third alignment key according to an embodiment, FIG. 26 is a cross-sectional view of a color conversion substrate taken along line E-E' in FIG. 25 according to an embodiment, FIG. 27 is a schematic plan view of a fourth alignment key according to an embodiment, FIG. 28 is a cross-sectional view of a color conversion substrate taken along line F-F' in FIG. 27 according to an embodiment, FIG. 29 is a schematic plan view of a fifth alignment key according to an embodiment, FIG. 30 is a cross-sectional view of a color conversion substrate taken along line G-G' in FIG. 29 according to an embodiment, FIG. 31 is a schematic plan view of a sixth alignment key according to an embodiment, FIG. 32 is a cross-sectional view of a color conversion taken along line H-H' in FIG. 31 substrate according to an embodiment, FIG. 33 is a schematic plan view of a seventh alignment key according to an embodiment, FIG. 34 is a cross-sectional view of a color conversion substrate taken along line I-I' in FIG. 33 according to an embodiment, FIG. 35 is a schematic plan view of a eighth alignment key according to an embodiment, and FIG. 36 is a cross-sectional view of a color conversion substrate taken along line J-J' in FIG. 35 according to an embodiment.

Referring to FIGS. 21 and 22, the color conversion substrate 30 according to an embodiment may include a non-display area NDA and a display area DA on the second substrate 310. The non-display area NDA may include an alignment region 90, and a first alignment key 410 may be disposed in the alignment region 90. The display area DA may be provided with a first color filter 231, a first color pattern 251, a second color pattern 252, and a third color pattern 253.

The first alignment key 410 may include a first alignment pattern 501 and a first layer pattern 610. The first alignment pattern 501 may include a first main portion 571, a first reference portion 531, and a first sub-protrusion portion 551. The first main portion 571, the first reference portion 531, and the first sub-protrusion portion 551 of the first alignment pattern 501 may be formed in advance before the first layer pattern 610 is formed. In another embodiment, the first protrusion 551 may be formed simultaneously with the first layer pattern 610. The first layer pattern 610 may be spaced apart from the first main portion 571 of the first alignment pattern 501 with a first opening 591 interposed therebetween. Since the first alignment key 410 includes the first sub-protrusion portion 551, the first alignment key 410 represents decimal number 1, and thus it may be found that the first layer pattern 610 formed in the first alignment key 410 is formed by the first mask process.

When the first color filter 231, the first color pattern 251, the second color pattern 252, and the third color pattern 253 are formed in the display area DA of the second substrate 310, the first layer pattern 610 may be simultaneously formed by the first mask process. The first layer pattern 610 may be formed of the same material as the first color filter 231, the first color pattern 251, the second color pattern 252, and the third color pattern 253. The first layer pattern 610 may be formed to have the same thickness as the first color filter 231, the first color pattern 251, the second color pattern 252, and the third color pattern 253.

As described above, it may be found that the first color filter 231, the first color pattern 251, the second color pattern 252, and the third color pattern 253 are formed in the display area DA of the second substrate 310 through the first layer pattern 610 formed in the first alignment key 410. Further, it may be found that whether the first color filter 231, the first color pattern 251, the second color pattern 252, and the third color pattern 253 are aligned may be checked according to the position of the first layer pattern 610.

Referring to FIGS. 23 and 24, in the color conversion substrate 30 according to an embodiment, a second alignment key 420 may be disposed in the alignment region 90. The display area DA may be provided with a first light blocking member 221 disposed on the first color pattern 251, a second light blocking member 222 disposed on the second color pattern 252, and a third light blocking member 223 disposed on the third color pattern 253.

The second alignment key 420 may include a second alignment pattern 502 and a second layer pattern 620. The second alignment pattern 502 may include a second main portion 572, a second reference portion 532, and a second sub-protrusion portion 552. The second main portion 572, the second reference portion 532, and the second sub-protrusion portion 552 of the second alignment pattern 502 may be formed in advance before the second layer pattern 620 is formed. The second layer pattern 620 may be spaced apart from the second main portion 572 of the second alignment pattern 502 with a second opening 592 interposed therebetween. Since the second alignment key 420 includes the second sub-protrusion portion 552, the second alignment key 420 represents decimal number 2, and thus it may be found that the second layer pattern 620 formed in the second alignment key 420 is formed by the second mask process.

When the first light blocking member 221, the second light blocking member 222, and the third light blocking member 223 are formed in the display area DA of the second substrate 310, the second layer pattern 620 may be simultaneously formed by the second mask process. The second layer pattern 620 may be formed of the same material as the first light blocking member 221, the second light blocking member 222, and the third light blocking member 223. The second layer pattern 620 may be formed to have the same thickness as the first light blocking member 221, the second light blocking member 222, and the third light blocking member 223.

As described above, it may be found that the first light blocking member 221, the second light blocking member 222, and the third light blocking member 223 are formed in the display area DA of the second substrate 310 through the second layer pattern 620 formed in the second alignment key 420. Further, it may be found that whether the first light blocking member 221, the second light blocking member 222, and the third light blocking member 223 are aligned may be checked according to the position of the second layer pattern 620.

Referring to FIGS. 25 and 26, in the color conversion substrate 30 according to an embodiment, a third alignment key 430 may be disposed in the alignment region 90. In the display area DA, a second color filter 233 may be additionally disposed between the first color pattern 251 and the second color pattern 252.

The third alignment key 430 may include a third alignment pattern 503 and a third layer pattern 630. The third alignment pattern 503 may include a third main portion 573, a third reference portion 533, a first sub-protrusion portion 551, and a second sub-protrusion portion 552. The third main portion 573, the third reference portion 533, the first sub-protrusion 551 and the second sub-protrusion 552 of the third alignment pattern 503 may be formed in advance before the third layer pattern 630 is formed. The third layer pattern 630 may be spaced apart from the third main portion 573 of the third alignment pattern 503 with a third opening 593 interposed therebetween. Since the third alignment key 430 includes the first sub-protrusion portion 551 and the second sub-protrusion portion 552, the third alignment key 430 represents decimal number 3, and thus it may be found that the third layer pattern 630 formed in the third alignment key 430 is formed by the third mask process.

When the second color filter 233 is formed in the display area DA of the second substrate 310, the third layer pattern 630 may be simultaneously formed by the third mask process. The third layer pattern 630 may be formed of the same material as the second color filter 233. The third layer pattern 630 may be formed to have the same thickness as the second color filter 233.

As described above, it may be found that the second color filter 233 is formed in the display area DA of the second substrate 310 through the third layer pattern 630 formed in the third alignment key 430. Further, it may be found that whether the second color filter 233 is aligned may be checked according to the position of the third layer pattern 630.

Referring to FIGS. 27 and 28, in the color conversion substrate 30 according to an embodiment, a fourth alignment key 440 may be disposed in the alignment region 90. In the display area DA, a third color filter 235 may be additionally disposed between the second color pattern 252 and the third color pattern 253.

The fourth alignment key 440 may include a fourth alignment pattern 504 and a fourth layer pattern 640. The fourth alignment pattern 504 may include a fourth main portion 574, a fourth reference portion 534, and a third sub-protrusion portion 553. The fourth main portion 574, the fourth reference portion 534 and the third sub-protrusion portion 553 of the fourth alignment pattern 504 may be formed in advance before the fourth layer pattern 640 is formed. The fourth layer pattern 640 may be spaced apart from the fourth main portion 574 of the fourth alignment pattern 504 with a fourth opening 594 therebetween. Since the fourth alignment key 440 includes the third sub-protrusion portion 553, the fourth alignment key 440 represents decimal number 4, and thus it may be found that the fourth layer pattern 640 formed in the fourth alignment key 440 is formed by the fourth mask process.

When the third color filter 235 is formed in the display area DA of the second substrate 310, the fourth layer pattern 640 may be simultaneously formed by the fourth mask process. The fourth layer pattern 640 may be formed of the same material as the third color filter 235. The fourth layer pattern 640 may be formed to have the same thickness as the third color filter 235.

As described above, it may be found that the third color filter 235 is formed in the display area DA of the second substrate 310 through the fourth layer pattern 640 formed in the fourth alignment key 440. Further, it may be found that whether the third color filter 235 is aligned may be checked according to the position of the fourth layer pattern 640.

Referring to FIGS. 29 and 30, in the color conversion substrate 30 according to an embodiment, a fifth alignment key 450 may be disposed in the alignment region 90. In the display area DA, a first capping layer 391 and a light transmitting pattern 330 disposed on the first capping layer 391 and overlapping the first color filter 231 may be additionally disposed.

The fifth alignment key 450 may include a fifth alignment pattern 505 and a fifth layer pattern 650. The fifth alignment pattern 505 may include a fifth main portion 575, a fifth reference portion 535, a first protrusion portion 551, and a third sub-protrusion portion 553. The fifth main portion 575, the fifth reference portion 535, the first protrusion portion 551, and the third sub-protrusion portion 553 of the fifth alignment pattern 505 may be formed in advance before the fifth layer pattern 650 is formed. The fifth layer pattern 650 may be spaced apart from the fifth main portion 575 of the fifth alignment pattern 505 with a fifth opening 595 therebetween. Since the fifth alignment key 450 includes the first protrusion portion 551 and the third sub-protrusion portion 553, the fifth alignment key 450 represents decimal number 5, and thus it may be found that the fifth layer pattern 640 formed in the fifth alignment key 450 is formed by the fifth mask process.

When the light transmitting pattern 330 is formed in the display area DA of the second substrate 310, the fifth layer pattern 650 may be simultaneously formed by the fifth mask process. The fifth layer pattern 650 may be formed of the same material as the light transmitting pattern 330. The fifth layer pattern 650 may be formed to have the same thickness as the light transmitting pattern 330. Since the first capping layer 391 is formed in the entire display area DA of the second substrate 310, the alignment thereof is not required, and thus an alignment key is not separately provided.

As described above, it may be found that the light transmitting pattern 330 is formed in the display area DA of the second substrate 310 through the fifth layer pattern 650 formed in the fifth alignment key 450. Further, it may be found that whether the light transmitting pattern 330 is aligned may be checked according to the position of the fifth layer pattern 650.

Referring to FIGS. 31 and 32, in the color conversion substrate 30 according to an embodiment, a sixth alignment key 460 may be disposed in the alignment region 90. In the display area DA, a first wavelength conversion pattern 340 overlapping the second color filter 233 may be additionally disposed on the first capping layer 391.

The sixth alignment key 460 may include a sixth alignment pattern 506 and a sixth layer pattern 660. The sixth alignment pattern 506 may include a sixth main portion 576, a sixth reference portion 536, a second sub-protrusion portion 552, and a third sub-protrusion portion 553. The sixth main portion 576, the sixth reference portion 536, the second sub-protrusion portion 552, and the third sub-protrusion portion 553 of the sixth alignment pattern 506 may be formed in advance before the sixth layer pattern 660 is formed. The sixth layer pattern 660 may be spaced apart from the sixth main portion 576 of the sixth alignment pattern 506 with a sixth opening 596 therebetween. Since the sixth alignment key 460 includes the sub-protrusion protrusion portion 552 and the third protrusion portion 553, the sixth alignment key 460 represents decimal number 6, and thus it may be found that the sixth layer pattern 660 formed in the sixth alignment key 460 is formed by the sixth mask process.

When the first wavelength conversion pattern 340 is formed in the display area DA of the second substrate 310, the sixth layer pattern 660 may be simultaneously formed by the sixth mask process. The sixth layer pattern 660 may be formed of the same material as the first wavelength conversion pattern 340. The sixth layer pattern 660 may be formed to have the same thickness as the first wavelength conversion pattern 340.

As described above, it may be found that the first wavelength conversion pattern 340 is formed in the display area DA of the second substrate 310 through the sixth layer pattern 660 formed in the sixth alignment key 460. Further, it may be found that whether the first wavelength conversion pattern 340 is aligned may be checked according to the position of the sixth layer pattern 660.

Referring to FIGS. 33 and 34, in the color conversion substrate 30 according to an embodiment, a seventh alignment key 470 may be disposed in the alignment region 90. In the display area DA, a second wavelength conversion pattern 350 overlapping the third color filter 235 may be additionally disposed on the first capping layer 391.

The seventh alignment key 470 may include a seventh alignment pattern 507 and a seventh layer pattern 670. The seventh alignment pattern 507 may include a seventh main portion 577, a seventh reference portion 537, a first sub-protrusion portion 551, a second sub-protrusion portion 552, and a third sub-protrusion portion 553. The seventh main portion 577, the seventh reference portion 537, the first sub-protrusion portion 551, the second sub-protrusion portion 552, and the third sub-protrusion portion 553 of the seventh alignment pattern 507 may be formed in advance before the seventh layer pattern 670 is formed. The seventh layer pattern 670 may be spaced apart from the seventh main portion 577 of the seventh alignment pattern 507 with a seventh opening 597 therebetween.

Since the seventh alignment key 470 includes the first sub-protrusion portion 551, the second sub-protrusion portion 552, and the third sub-protrusion portion 553, the seventh alignment key 470 represents decimal number 7, and thus it may be found that the seventh layer pattern 670 formed in seventh alignment key 470 is formed by the seventh mask process.

When the second wavelength conversion pattern 350 is formed in the display area DA of the second substrate 310, the seventh layer pattern 670 may be simultaneously formed by the seventh mask process. The seventh layer pattern 670 may be formed of the same material as the second wavelength conversion pattern 350. The seventh layer pattern 670 may be formed to have the same thickness as the second wavelength conversion pattern 350.

As described above, it may be found that the second wavelength conversion pattern 350 is formed in the display area DA of the second substrate 310 through the seventh layer pattern 670 formed in the seventh alignment key 470. Further, it may be found that whether the second wavelength conversion pattern 350 is aligned may be checked according to the position of the seventh layer pattern 670.

Referring to FIGS. 35 and 36, in the color conversion substrate 30 according to an embodiment, an eighth alignment key 480 may be disposed in the alignment region 90. In the display area DA, a second capping layer 393 and a color mixing prevention member 370 disposed on the second capping layer 393 and overlapping the first light blocking member 221, the second light blocking member 222, and the third light blocking member 223 may be additionally disposed.

The eighth alignment key 480 may include an eighth alignment pattern 508 and an eighth layer pattern 680. The eighth alignment pattern 508 may include an eighth main portion 578, an eighth reference portion 538, and a fourth sub-protrusion portion 554. The eighth main portion 578, the eighth reference portion 538, and the fourth sub-protrusion portion 554 of the eighth alignment pattern 508 may be formed in advance before the eighth layer pattern 680 is formed. The eighth layer pattern 680 may be spaced apart from the eighth main portion 578 of the eighth alignment pattern 508 with a eighth opening 598 therebetween. Since the eighth alignment key 480 includes the fourth sub-protrusion portion 554, the eighth alignment key 480 represents decimal number 8, and thus it may be found that the eighth layer pattern 640 formed in the eighth alignment key 480 is formed by the eighth mask process. Since the second capping layer 393 is formed in the entire display area DA of the second substrate 310, the alignment thereof is not required, and thus an alignment key is not separately provided.

When the color mixing prevention member 370 is formed in the display area DA of the second substrate 310, the eighth layer pattern 680 may be simultaneously formed by the eighth mask process. The eighth layer pattern 680 may be formed of the same material as the color mixing prevention member 370. The eighth layer pattern 680 may be formed to have the same thickness as the color mixing prevention member 370.

As described above, it may be found that the color mixing prevention member 370 is formed in the display area DA of the second substrate 310 through the eighth layer pattern 680 formed in the eighth alignment key 480. Further, it may be found that whether the color mixing prevention member 370 is aligned may be checked according to the position of the eighth layer pattern 680.

In the above-described embodiments, the alignment keys provided on the color conversion substrate 30 are described as examples, but the disclosure is not limited thereto, and the alignment keys are provided on the display substrate 10 to measure the alignment degree of the layers formed on the display substrate 10.

Further, in the above-described embodiments, a case where the alignment key has a rectangular shape and represents a decimal number of 1 to 63 according to the protrusion portions arranged at the first to sixth positions of three corners has been described as an example. However, the disclosure is not limited thereto. When the alignment key has a pentagon or a higher polygon, the protrusion portions are arranged at larger number of positions, and thus more numbers may be represented according to the binary method.

According to a display device according to an embodiment, distinguishing of layers may be facilitated by using a plurality of alignment keys having different protrusion arrangements according to the layers of the color conversion substrate.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device, comprising:

a substrate including a display area and a non-display area, the non-display area including an alignment region; and a first alignment key and a second alignment key, which are disposed in the alignment region, wherein the first alignment key includes a first alignment pattern having a first main portion which has a first closed polygon shape, a first reference portion protruding from the first main portion, and a first sub-protrusion portion protruding from the first main portion, spaced apart from the first reference portion and protruding parallel to the first reference portion in a same direction as the first reference portion, and the second alignment key includes a second alignment pattern having a second main portion which has a second closed polygon shape, a second reference portion protruding from the second main portion, and a second sub-protrusion portion protruding from the second main portion, spaced apart from the second reference portion, and protruding in a different direction from the second reference portion, and wherein the first reference portion for the first alignment key is arranged at a first corner of the first main portion where two edges of the first main portion meet and the second reference portion for the second alignment key is arranged at a first corner of the second main portion where two edges of the second main portion meet, and the first sub-protrusion portion for the first alignment key is arranged on a second corner of the first main portion and the second sub-protrusion portion for the second alignment key is arranged on a second corner of the second main portion, wherein the first alignment key and the second alignment key have different planar shapes from each other, wherein the alignment region is disposed on one corner of the substrate where two sides of the substrate meet, and a length of the alignment region including the first alignment key and the second alignment key in a vertical direction as seen in plan view is less than a length of the display area of the substrate in the vertical direction as seen in the plan view, wherein the first alignment key and the second alignment key are adjacent to each other in the alignment region, and wherein a center of the first alignment key and a center of the second alignment key do not overlap in the plan view.

2. The display device of claim 1, wherein the first reference portion of the first alignment key and the second reference portion of the second alignment key extend and protrude outward from the first corner of the first main portion and the first corner of the second main portion respectively.

3. The display device of claim 2, wherein the first sub-protrusion portion of the first alignment key and the second sub-protrusion portion of the second alignment key extend and protrude outward from the second corner of the first main portion and the second corner of the second main portion respectively.

4. The display device of claim 1, wherein the first reference portion of the first alignment key and the first sub-protrusion portion of the first alignment key have different planar shapes from each other.

5. The display device of claim 1, wherein the first reference portion and the first sub-protrusion portion have a same planar shape as each other, and have different planar areas from each other.

6. The display device of claim 1, wherein the first alignment key further includes a first layer pattern disposed at a center of the first main portion of the first alignment pattern, and the second alignment key further includes a second layer pattern disposed at a center of the second main portion of the second alignment pattern.

7. The display device of claim 6, wherein the first alignment pattern of the first alignment key includes an opening formed between the first layer pattern and the first main portion of the first alignment pattern, and the first layer pattern is spaced apart from the first main portion.

8. The display device of claim 6, wherein the first main portion, the first reference portion of the first alignment key, and the first sub-protrusion portion of the first alignment key, and the first layer pattern of the first alignment key are disposed on a same layer.

9. The display device of claim 6, wherein the first layer pattern includes two pairs of outer sides facing opposite directions, and wherein, in the plan view, the first reference portion of the first alignment key and the first sub-protrusion portion of the first alignment key do not overlap a first partition region defined by imaginary extension lines of the outer sides.

10. The display device of claim 9, wherein an alignment degree of the first layer pattern is determined by measuring a distance between one inner side of the first main portion of the first alignment key in the first partition region of the first alignment key and one outer side of the first layer pattern of the first alignment key adjacent to the one inner side of the first main portion of the first alignment key and facing the one inner side of the first main portion of the first alignment key.

11. An electronic device comprising:

a substrate including a display area and a non-display area, the non-display area including an alignment region;

a first alignment key and a second alignment key, which are disposed in the alignment region;

a first color filter, a first color pattern, a second color pattern, and a third color pattern, which are disposed on the substrate;

a first light blocking member disposed on the first color pattern, a second light blocking member disposed on the second color pattern, and a third light blocking member disposed on the third color pattern;

a second color filter disposed between the first light blocking member and the second light blocking member, and a third color filter disposed between the second light blocking member and the third light blocking member;

a light transmitting pattern disposed on the first color filter to overlap the first color filter, a first wavelength conversion pattern disposed on the second color filter to overlap the second color filter, and a second wavelength conversion pattern disposed on the third color filter to overlap the third color filter; and a color mixing prevention member disposed between the light transmitting pattern and the first wavelength conversion pattern, and disposed between the first wavelength conversion pattern and the second wavelength conversion pattern, wherein the first alignment key includes a first alignment pattern having a first main portion which has a first closed polygon shape, a first reference portion protruding from the first main portion, and a first sub-protrusion portion protruding from the first main portion, spaced apart from the first reference portion and protruding parallel to the first reference portion in a same direction as the first reference portion, and the second alignment key includes a second alignment pattern having a second main portion which has a second closed polygon shape, a second reference portion protruding from the second main portion, and a second sub-protrusion portion protruding from the second main portion, spaced apart from the second reference portion, and protruding in a different direction from the second reference portion, and wherein the first reference portion for the first alignment key is arranged at a first corner of the first main portion where two edges of the first main portion meet and the second reference portion for the second alignment key is arranged at a first corner of the second main portion where two edges of the second main portion meet, and the first sub-protrusion portion for the first alignment key is arranged on a second corner of the first main portion and the second sub-protrusion portion for the second alignment key is arranged on a second corner of the second main portion, and wherein the first alignment key and the second alignment key have different planar shapes from each other, wherein the first alignment key further includes a first layer pattern disposed at a center of the first main portion of the first alignment pattern, and the second alignment key further includes a second layer pattern disposed at a center of the second main portion of the second alignment pattern, and wherein the first layer pattern or the second layer pattern includes a same material as any one of the first color filter, the first light blocking member, the second light blocking member, the third light blocking member, the second color filter, the third color filter, the light transmitting pattern, the first wavelength conversion pattern, the second wavelength conversion pattern, and the color mixing prevention member.

12. A display device, comprising:

a display area and a non-display area, the non-display area including an alignment region; and a plurality of alignment keys disposed in the alignment region, wherein each alignment key of the plurality of alignment keys includes an alignment pattern having a main portion which is a closed polygon shape, a reference portion protruding from the main portion, and a sub-protrusion portion protruding from the main portion and spaced apart from the reference portion, and a layer pattern spaced apart from the main portion and disposed at a center of the main portion, wherein, in each alignment key of the plurality of alignment keys, the reference portion is arranged at one corner of the main portion, where two edges of the main portion meet, and the sub-protrusion portion is arranged on an other corner of the main portion, and wherein the layer pattern respectively provided in each alignment key of the plurality of alignment keys includes a different material from the layer pattern respectively provided in each other alignment key of the plurality of alignment keys, and the layer pattern in each alignment key of the plurality of alignment keys includes a same material as one of a plurality of layers of a color conversion substrate in the display area of the substrate, wherein each alignment key of the plurality of alignment keys has a different planar shape from each other alignment key of the plurality of alignment keys, wherein the alignment region is disposed on one corner of the color conversion substrate where two sides of the color conversion substrate meet, wherein the plurality of alignment keys includes a first alignment key and a second alignment key, wherein the first alignment key and the second alignment key are adjacent to each other in the alignment region, wherein a center of the first alignment key and a center of the second alignment key do not overlap in a plan view, and wherein the layer pattern in each alignment key of the plurality of alignment keys is disposed on a same layer as each other alignment key of the plurality of alignment keys.

13. The display device of claim 12, wherein, as seen in the plan view, the main portion of each alignment key of the plurality of alignment keys includes first and second sides facing each other, a third side intersecting the first side, and a fourth side facing the third side, and around the main portion of each alignment key of the plurality of alignment keys, there is a first region of the first side protruding in an extending direction of the fourth side and adjacent to the fourth side, a second region of the fourth side protruding in an extending direction of the first side and adjacent to the first side, a third region of the fourth side protruding in an extending direction of the first side and adjacent to the second side, a fourth region of the second side protruding in an extending direction of the fourth side and adjacent to the fourth side, a fifth region of the second side protruding in an extending direction of the fourth side and adjacent to the third side, and a sixth region of the third side protruding in an extending direction of the first side and adjacent to the second side.

14. The display device of claim 13, wherein the first region of each alignment key of the plurality of alignment keys represents a site of 0th power of 2 in binary number, the second region of each alignment key of the plurality of alignment keys represents a site of 1st power of 2 in binary number, the third region of each alignment key of the plurality of alignment keys represents a site of 2nd power of 2 in binary number, the fourth region of each alignment key of the plurality of alignment keys represents a site of 3rd power of 2 in binary number, the fifth region of each alignment key of the plurality of alignment keys represents a site of 4th power of 2 in binary number, and the sixth region of each alignment key of the plurality of alignment keys represents a site of 5th power of 2 in binary number, and wherein, in each alignment key of the plurality of alignment keys when the sub-protrusion portion is disposed in one of the first to sixth regions, a binary number of 1 is represented, and when the sub-protrusion portion is not disposed in the others of the first to sixth regions, a binary number of 0 is represented.

15. The display device of claim 14, wherein the plurality of alignment keys further includes a third alignment key, a fourth alignment key, a fifth alignment key, a sixth alignment key, a seventh alignment key, and an eighth alignment key, and the first through eighth alignment keys are spaced apart from each other, the sub-protrusion portion of the first alignment key includes a first sub-protrusion portion formed in the first region that represents a binary number of 000001, which is a decimal number of 1, the sub-protrusion portion of the second alignment key includes a second sub-protrusion portion formed in the second region that represents a binary number of 000010, which is a decimal number of 2, the sub-protrusion portion of the third alignment key includes a third sub-protrusion portion formed in the first region and a fourth sub-protrusion portion formed in the first region and the second region that represent a binary number of 000011 which is a decimal number of 3, the sub-protrusion portion of the fourth alignment key includes a fifth sub-protrusion portion formed in the third region that represents a binary number of 000100, which is a decimal number of 4, the sub-protrusion portion of the fifth alignment key includes a sixth sub-protrusion portion formed in the first region and a seventh sub-protrusion portion formed in the third region that represent a binary number of 000101, which is a decimal number of 5, the sub-protrusion portion of the sixth alignment key includes an eighth sub-protrusion portion formed in the second region and a ninth sub-protrusion portion formed in the third region that represent a binary number of 000110, which is a decimal number of 6, the sub-protrusion portion of the seventh alignment key includes a tenth sub-protrusion portion formed in the first region, an eleventh sub-protrusion portion formed in the second region and a twelfth sub-protrusion portion formed in the third region that represent a binary number of 000111, which is a decimal number of 7, and the sub-protrusion portion of the eighth alignment key includes a thirteenth sub-protrusion portion formed in the fourth region that represents a binary number of 001000, which is a decimal number of 8.

16. The display device of claim 12, wherein, in each alignment key of the plurality of alignment keys, the reference portion of each of the plurality of alignment keys extends and protrudes outward from the main portion.

17. The display device of claim 12, wherein, in each alignment key of the plurality of alignment keys, the main portion, the reference portion, and the sub-protrusion portion of each, and the layer pattern are disposed on a same layer.

18. The display device of claim 13, wherein, in each alignment key of the plurality of alignment keys, the layer pattern of each includes two pairs of lateral sides facing each other, and, as seen in the plan view, the reference portion and the sub-protrusion portion do not overlap a partition region defined by extension lines of the lateral sides, wherein the two pairs of lateral sides of the layer pattern comprises a first side, a second side facing the first side, a third side intersecting the first side, and a fourth side facing the third side.

19. The display device of claim 18, wherein, in each alignment key of the plurality of alignment keys, an alignment degree of the layer pattern is determined by measuring a distance between the first side of the main portion and the first side of the layer pattern of the alignment key to be measured, and the first side of the layer pattern is adjacent to and facing the first side of the main portion.

20. The display device of claim 12, further comprising: a display substrate facing the color conversion substrate and including at least one light emitting element; and a filler disposed between the color conversion substrate and the display substrate.

\* \* \* \* \*